United States Patent
Karunaratne

(10) Patent No.: US 7,313,510 B2
(45) Date of Patent: Dec. 25, 2007

(54) METHODS FOR ESTIMATING POWER REQUIREMENTS OF CIRCUIT DESIGNS

(75) Inventor: Maddumage D. G. Karunaratne, San Jose, CA (US)

(73) Assignee: V-Cube Technology Corp., Fremont, CA (US)

( * ) Notice: Subject to any disclaimer, the term of this patent is extended or adjusted under 35 U.S.C. 154(b) by 525 days.

(21) Appl. No.: 10/452,498

(22) Filed: Jun. 2, 2003

(65) Prior Publication Data
US 2004/0243376 A1  Dec. 2, 2004

(51) Int. Cl.
G06F 17/50 (2006.01)
G06G 7/62 (2006.01)

(52) U.S. Cl. .......................... 703/14; 703/13
(58) Field of Classification Search ............... 703/14, 703/13, 18
See application file for complete search history.

(56) References Cited

U.S. PATENT DOCUMENTS

| | | | |
|---|---|---|---|
| 5,473,548 A | 12/1995 | Omori et al. ................... 716/6 |
| 5,625,803 A * | 4/1997 | McNelly et al. ............... 703/14 |
| 5,673,420 A | 9/1997 | Reyes et al. ................... 716/4 |
| 5,696,694 A | 12/1997 | Khouja et al. ................. 716/5 |
| 5,768,145 A | 6/1998 | Roethig ........................ 703/14 |
| 5,838,947 A | 11/1998 | Sarin ............................ 703/14 |
| 5,847,966 A | 12/1998 | Uchino et al. ................. 716/2 |
| 6,321,185 B1 | 11/2001 | Takahashi ..................... 703/15 |
| 6,363,515 B1 | 3/2002 | Rajgopal et al. ............... 716/5 |

OTHER PUBLICATIONS

Synopsys Power Starter Kit, PowerGate Full Chip Power Verification, Version 4.0, Dec. 15, 1999, pp. 16-23.*
Synopsys Power Starter Kit, PowerGate Full Chip Power Verification, Version 4.0, Dec. 15, 1999, pp. 130, 135.*
Das and Gladden; RTL Low Power Techniques for System-On-Chip Designs; SNUG (Synopsys Users Group) Papers and Presentations; San Jose, 1999, pp. 1-15.*
"Genetic Algorithms for VLSI Design, Layout & Test Automation" by P. Mazumder and E. M. Rudnick; Publisher Prentice Hall PTR, Upper Saddle River, NJ 07458, 1999, Chap. 7, pp. 228-251.
"Maximum Power Estimation for CMOS Circuits Using Deterministic and Statistical Approaches" by Chuan-Yu Wang and Kaushik Roy, IEEE Trans. VLSI Systems, vol. 6, No. 1, Mar. 1998, pp. 134-140.

* cited by examiner

Primary Examiner—Paul Rodriguez
Assistant Examiner—J. C. Ochoa
(74) Attorney, Agent, or Firm—Michael B. Einschlag

(57) ABSTRACT

One embodiment of the present invention is a method for estimating a power requirement of a circuit design that includes steps of: (a) selecting a set of targeted Energy Arcs and/or Power Arcs; (b) creating one or more circuit states using the set of targeted Energy Arcs and/or Power Arcs; (c) back-tracing the one or more circuit states over one or more simulation clock cycles to form a start circuit state and a stimulus segment; (d) simulating the stimulus segment in forward time progression and determining which Event Arcs in Energy Arcs and/or which Condition Arcs in Power Arcs are satisfied at each stimulus clock cycle; and (e) recording data at each stimulus clock cycle that is utilized to estimate the power requirement.

10 Claims, 4 Drawing Sheets

METHODS FOR ESTIMATING POWER REQUIREMENTS OF CIRCUIT DESIGNS

TECHNICAL FIELD OF THE INVENTION

One or more embodiments of the present invention pertain to methods for estimating power requirements of electronic circuit designs such as, for example and without limitation, integrated circuit ("IC") designs.

BACKGROUND OF THE INVENTION

It is well known in the art that it is desirable to estimate the power requirements of an integrated circuit ("IC") chip, a device, or circuit at the design stage, for example and without limitation, to inform decisions relating to its fabrication. As used herein, and as is readily understood by one of ordinary skill in the art, power is defined as a rate at which energy is generated or consumed. As such, estimates of power dissipation of an electronic device are substantially the same as estimates of power required for that device to operate under the same conditions because virtually all the energy used to operate the electronic device ends up being dissipated. Thus, the terms power dissipation and power requirements are used herein interchangeably.

As is also well known, the power requirements of an electronic device are typically divided into three categories designated as: (a) static power; (b) dynamic power; and (c) peak power. Static power (also known as leakage power) is power that is dissipated as a result of leakage current being produced whenever the device is powered but not operated as intended. As is well known, static power is typically relatively small, and it can readily be estimated using well known prior art methods from "resting" or "idling" conditions and internal data values (for example, a set of signal values that are either known or are determined by simulating a "reset sequence" in accordance with any one of a number of methods that are well known to those of ordinary skill in the art).

Power dissipated whenever the device is operated as intended in various ways is termed dynamic power or dynamic power dissipation. As is well known, as external signals applied to a device change, internal signals in the device may also change dynamically with time, and as a result, energy is dissipated. This energy is the power dissipation over the period of time the device was working. As one can readily appreciate from this, the dynamic power depends on switching activity of the signals in the device, which switching activity depends, in turn, on the application being run on the device, or the conditions under which the device is being used. Typically, the duration of such applications are sufficiently long to warrant (but not necessarily be limited to) a single measure of dynamic power for the device. As is known, to ensure that a device can perform its functions over a long period of time, or indefinitely, estimates of dynamic power should be on the high side, which high side estimates can be termed a worst-case dynamic power of the circuit design. Then, the device should be manufactured to sustain the worst-case dynamic power over a long period of time or indefinitely.

Peak power is the highest power or energy dissipated in a short period of time, which period could be as small as a single operating cycle or several consecutive operating cycles (an operating cycle is basically a clock cycle or a period of time a signal needs to settle after a change of value). As is well known, a clock signal is a signal that changes in a regular pattern over time, and is distributed to various parts of the device. Clock signals are used in electronic and semiconductor devices among other things to synchronize data, and a device may have one or many externally supplied, internally generated, or internally derived clock signals, which are all labeled as clocks herein. As is well known, in circuits, clock signals may operate at different frequencies, and some of them are designed to operate synchronized in time (similar waveforms with respect to time). However, in a simulation environment for a circuit design, it is possible to have clock signals deviate from their intended timing waveform behavior. For example, a derived clock may be expected to operate at half the frequency of its source according to its specifications. However, in the simulation environment, the derived clock could be forced by a stimulus to operate at a different frequency from its specification. Peak power, in addition to static and dynamic power, is a requirement to be considered at the planning, implementation, and utilization stages of a device design to determine voltage supply and current needs of a device and its systems.

Prior art methods used at present for estimating dynamic power have not proved practical in most cases, particularly for use with large devices or circuit designs. In particular, semiconductor circuit designers currently use, for example and without limitation, one of the following methods for estimating dynamic power using computer software programs (for example, Electronic Design Automation tools which also referred to in the art and herein as "EDA Tools") or simple manual calculations: (a) estimating dynamic power using prior knowledge; (b) estimating dynamic power by performing hand calculations; (c) estimating dynamic power using a simulation of user provided stimulus data; (d) estimating dynamic power using probability-based calculations; and (e) estimating dynamic power using simulation based stimulus generation schemes. All these methods are problematic.

In particular, a method for estimating dynamic power using prior knowledge may be carried out as follows. The power dissipated by an already manufactured circuit design can be measured by a specially designed hardware (tester) while the device is subjected to a typical application. In particular, using various application situations, one can find the worst-case average dynamic power and other requirements of the device. Then, when a new circuit or device is designed which is an enhancement or a derivation of the measured device it is possible to estimate the power requirement of the new design by extrapolating the known data to include changes in device size, area, operation speeds, and so forth. Some problems with this method are a lack of prior knowledge of power dissipated by a previous design, and the difficulty of quantifying the amount of changes the new design has gone through. In essence, this method merely entails guesswork.

A method for estimating dynamic power by performing hand calculations may be carried out as follows. A circuit design typically includes many functional and logical sections or blocks. In fact a new circuit design could even be a collection of several smaller designs. Thus, if the power dissipated by each block were known, these power dissipations could be added up to obtain the total power dissipation of the circuit design. In essence, in accordance with this method, simple calculations may be made manually, and they are presented in a Spread Sheet or in tabulation. Some of the problems with this method are that the power dissipated by some blocks is unknown or is hard to determine using any of the above-listed methods. In addition, power data provided by parties designing different circuit blocks may not be reliable. As a result, this method also becomes guesswork.

A method of estimating dynamic power using a simulation of user provided stimulus data may be carried out as follows. During the course of a circuit design, the circuit design team studies, verifies, and tests the circuit design using simulation methods including data and conditions applied to signals in the circuit design. These data and conditions are known as stimulus data sets (they are sometimes referred to in the art as stimulus vector sets). To estimate dynamic power, a circuit design team may provide a stimulus data set or a stimulus vector set to be applied to the circuit design, which stimulus data set or stimulus vector set corresponds to a typical application of the circuit design. Ideally, the stimulus data set used should cause worst-case average power dissipation conditions, otherwise the final estimate of dynamic power could be too low. Next, the stimulus data set is simulated on the circuit design in accordance with any one of a number of methods that are well known to those of ordinary skill in the art, and all internal signal responses and changes are recorded as signal waveforms or as a signal Value Change Data ("VCD") file. Next, for example and without limitation, the signal VCD file can be processed to create signal switching activity summaries. In some cases, EDA tools used to carry out the simulation may: (a) consider specific data related to power/energy in Technology Library Cells (such data in Technology Library Cells are sometimes referred to as "Power Arcs" or "Energy Arcs," and such data introduce conditions to be met by the circuit design for proper performance and to characterize the cells); and (b) collect information related to how many such conditions are met ("satisfied") during each simulation cycle of the circuit design. Next, such collected signal switching data are applied to a Power Calculation Tool (for example, such a Power Calculation Tool may be any one of a number of such tools that are well known to those of ordinary skill in the art which are commercially available), which Power Calculation Tool provides average power dissipation figures based on the given data set. As is well known, Energy Arcs specify signal transition conditions for Technology Library Cells that, when met or satisfied, would release a specific finite amount of energy. Also, as is also well known, Power Arcs specify signal value conditions for Technology Library Cells that, when met or satisfied, would dissipate a certain amount of power until that condition changes. Thus, a collection of such "satisfied" Energy Arcs during a given simulation cycle releases a predetermined amount of energy, while a collection of such "satisfied" Power Arcs dissipate a predetermined amount of power that is used to calculate the energy dissipated in each simulation cycle. When the total energy released over an entire time period (i.e., a time period covering many simulation cycles during which the stimulus data set is applied to the circuit design) is considered, the circuit designer obtain the power dissipation of the circuit design. One problem with this method occurs in selecting an application-related stimulus data set to provide worst-case power dissipation scenarios. In essence, a circuit designer has no principled method for selecting a stimulus data set that will provide a worst-case average power dissipation scenario without trying several candidate stimulus data sets. The circuit designer may have some knowledge about how a particular stimulus data set affects the circuit design, but there is no way to validate a particular selection without trying several of them, because the overall behavior of a large and complex circuit design is hard to grasp. Another problem with this method is that the size of some designs is so large that it may take an impractically large amount of data and processing time to carry out the method. For example, for large circuit designs, stimulus data sets may have many thousands or even millions of cycles. Hence, simulation run times to produce signal value change data files may be very high, and the data file produced may overwhelm computer resources and/or EDA tools in subsequent steps to reach the final estimates. In addition, since stimulus data is contiguous, they cannot be broken into small sets, and they may have to be applied as a whole.

A method for estimating dynamic power using probability-based calculations may be carried out as follows. In accordance with this method, inputs of a circuit design are considered to have a certain amount of signal switching activity, which signal switching activity is expressed as a probability (for example and without limitation, a probability of having a logic value 1 or 0 as an input signal). These probabilities are propagated into internal signal nodes of the circuit design using simulation and probabilistic techniques in a well-known manner using, for example and without limitation, any algorithmic techniques including computer software programming and programs. The result is a set of switching probability values at external and internal circuit nodes. This value set is then considered to represent average switching activities at signal nodes, normalized (for example and without limitation, to a single simulation cycle) over time. Next, the switching data can be applied to any one of a number other EDA tools that are commercially available to obtain a power dissipation value. One problem with this method is that it uses probabilities as signal switching data, and that is a poor assumption. For example, in order for that assumption to be valid, the circuit design must undergo all combinations of possible signal value changes during its application for that power dissipation calculation to be valid. In addition, circuit designs have many levels of logic gates between external inputs and external outputs, and as switching probabilities are propagated into the circuit nodes, the switching probability of internal signal nodes deep inside the circuit design approaches zero. Therefore, since most large circuit designs are typically deep in logic levels, they will not have realistic switching probabilities at internal signal nodes. As a result, this method basically limits switching activities to areas close to the external boundary of the circuit design, and as a result, the calculated power dissipation may fall short of actual power dissipated by the circuit. Another problem results in using the method with circuits having embedded structures such as memories (RAMs), which dissipate a high level of power for certain operations such as read and write. If such memories were deep inside the circuit design, this method would find them to be almost inactive. However, if such memories were on the boundary of the circuit design, they would dominate the calculated power dissipation to an unacceptable degree, for example, 90% of power dissipation would be calculated as being produced by 2% of the circuit. A similar situation may arise due to circuit areas close to an external boundary providing most of the contribution to the final estimate, thus making results not meaningful.

A method for estimating dynamic power using simulation based stimulus generation schemes may be carried out as follows. The main idea in these stimulus generation schemes is to: (a) externally create a large number of stimuli data sets rapidly; (b) evaluate them; and (c) retain few of them. A stimulus data set can be generated in any well-known manner using, for example and without limitation, any algorithmic techniques using computer software. For example, a stimulus data set can be generated by: (a) using a random number generator; (b) applying Genetic Algorithmic techniques to external signal pins or to internal signal nodes that may be taken to be representative of the circuit state; or (c) a combination of (a) and (b). Next, each stimulus data set is simulated on the circuit design while a predetermined set of parameters are evaluated for each stimulus data set for each simulation cycle to decide whether to retain that stimulus data set or to generate another stimulus data set. For example, the parameters evaluated for each simulation cycle may be how fast the signals toggled, or how many Energy Arcs were satisfied. In addition, a simulation may also provide switching activities at external and internal circuit nodes. After applying a number of stimulus data sets, a set of switching activity data (sometimes referred to as a value set) has been collected which is considered to represent average switching activities at signal nodes. Next, the collected set of switching activity data is applied to any one of a number of other EDA tools that are commercially available to obtain a power dissipation value. Alternatively, the stimulus data sets that were retained can be applied to a simulation as if the circuit designer has supplied them to generate "VCD data file" as explained above in conjunction with the method estimating dynamic power using a simulation of user provided stimulus data. Each of these non-deterministic stimulus generation schemes exhibits the same weaknesses that were described above with respect to the probabilistic methods, namely, as data values propagate deeper in to the circuit design, the switching activity it would produce diminishes rapidly.

In light of the above, there is a need for methods for estimating the power requirements of a circuit design that solve or overcome one or more of the above-identified problems.

SUMMARY OF THE INVENTION

One or more embodiments of the present invention satisfy or overcome one or more of the above-identified problems in the art. In particular, one embodiment of the present invention is a method for estimating a power requirement of a circuit design that comprises steps of: (a) selecting a set of targeted Energy Arcs and/or Power Arcs; (b) creating one or more circuit states using the set of targeted Energy Arcs and/or Power Arcs; (c) back-tracing the one or more circuit states over one or more simulation clock cycles to form a start circuit state and a stimulus segment; (d) simulating the stimulus segment in forward time progression and determining which Event Arcs in Energy Arcs and/or which Condition Arcs in Power Arcs are satisfied at each stimulus clock cycle; and (e) recording data at each stimulus clock cycle that is utilized to estimate the power requirement.

DETAILED DESCRIPTION

Figure 1:
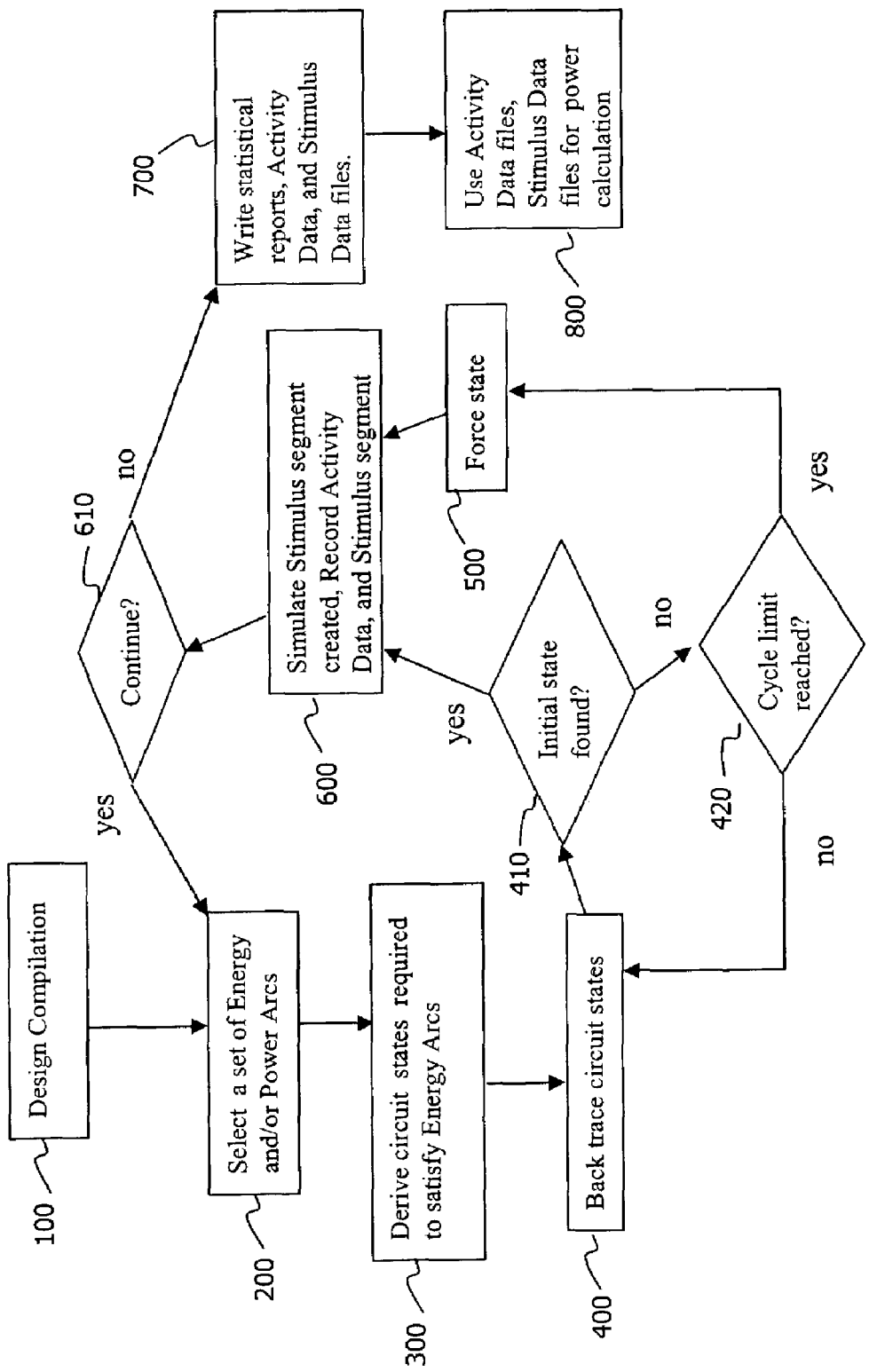
FIG. 1 shows a flow chart of a method for estimating power requirements of a circuit design in accordance with one or more embodiments of the present invention.

One or more embodiments of the present invention pertain to methods for estimating power requirements of electronic circuit designs such as, for example and without limitation, integrated circuit ("IC") designs. Before describing embodiments of the present invention, the following describes some nomenclature.

A typical circuit design comprises various circuit blocks (sometimes referred to as circuit design partitions) that perform various functions. Without such circuit design blocks or partitions, it would be impractical to design a large circuit. Thus, individual circuit blocks are designed, verified and integrated to create a final circuit design. In addition, large circuit design blocks may be broken down into smaller circuit design blocks based on functionality or other factors such as, for example and without limitation, whether a piece of the circuit design block may be created, generated, or supplied by a different organization. Such externally supplied or pre-designed circuit design blocks are sometimes referred to as design cores (sometimes also referred to as "IP" cores), and they may simply be embedded in a circuit design without being redesigned or changed at all. For example, a processor design core may simply be embedded in a controller circuit design without being changed at all. Eventually circuit design blocks may end up at a Technology Library Cell level (to be described in detail below), or some other smaller unit level (for example and without limitation, a transistor). Such circuit design blocks, when partitioned into smaller and smaller blocks, are sometimes referred to as hierarchy blocks.

The design and manufacture of semiconductor circuits (which semiconductor circuits may vary from an individual transistor to a large functional block such as, for example and without limitation, a microprocessor) may use different levels of circuit design blocks. In some cases, embedded circuit design blocks may be fabricated as a single large Cell (sometimes referred to as a macro Cell or a mega Cell). For example and without limitation, an embedded circuit design block may be: (a) a simple logic gate (for example and without limitation, an "and" gate, an "or" gate, and so forth); (b) a complex logic gate (for example and without limitation, an adder, a comparator, converter, and so forth); (c) a regular structure (for example and without limitation, Random Access Memory, CAM, ROM, FIFO, and so forth); (d) a macro Cell consisting of other Technology Library Cells; (e) a custom designed logic block; (f) a specially designed Intellectual Property (IP) Core; (g) a module; and (h) so forth. For simplicity in describing embodiments of the present invention, the following simply refers to all building blocks or circuit design blocks (at any level) of any circuit design as Cells.

Technology Library Cells: As is well known to those of ordinary skill in the art, Technology Library Cells serve as building blocks or circuit blocks for design and manufacture of semiconductor circuits, for example and without limitation, Application Specific Integrated Circuits ("ASICs"). Technology Library Cells may also be used directly to design microprocessors and custom-made circuits. As is well known, manufacturers know how to fabricate such Technology Library Cells in their manufacturing processes, and in practice, a semiconductor circuit design typically includes a large number of such Technology Library Cells that are interconnected to provide a particular set of functions as designed. Such Technology Library Cells can be small or large in size, and may provide different functionality.

Format and Content of Cells or Large Circuit Blocks: As is well known, semiconductor circuits and Cells may be described using any one of a number of formats that are well known to those of ordinary skill in the art such as, for example and without limitation, the following public domain formats: Verilog, ALF, VHDL, and EDIF. Other formats are proprietary formats such as, for example and without limitation, LIB, DB, DEF, GDS, GDSII, and so forth. Cells may contain several types of information denoted as [cell_j], where j refers to a particular type of information. The following describes several types of such information:

- [cell_1] Functional behavior of the Cell (sometimes referred to as its logical behavior). For example, a simple Cell may model a logical "and" operation, and its behavior may be given by, for example and without limitation, any of the following expressions: [1] Y=A & B; [2] AND (Y,A,B); [3] and(Y,A,B); [4] if (A & B) Y=1 else Y=0; and [5] a table format with discrete logical values, 0 and 1. The variables A, B, Y are signals of that Cell which may be used as leads in interconnections outside of the Cell (or as internals signals in the case of a complex Cell).
- [cell_2] Signal propagation delays and other timing-related information of the Cell. For example, a change in an incoming signal to a Cell may take 2 nanoseconds delay to reach the output of the Cell.
- [cell_3] Physical and manufacturing data/parameters of the Cell such as, for example and without limitation, length, width, height, aspect ratio, and so forth.
- [cell_4] Power and energy related information, and parameters characterizing the Cell. This may include details such as, for example and without limitation, how much energy would be released or power dissipated if a signal changes under certain conditions; relationships among signals, their values, and rates of change; how signals in Cells affect energy, power, their correlation to each other, and so forth.
- [cell_5] Other relevant information for appropriate use of the Cell in circuit designs, for example and without limitation, whether the Cell can be changed, reproduced with slight changes, and so forth due to technical and legal reasons, and so forth.
- [cell_6] Other characteristic information related, for example and without limitation, to signal changes, voltage and current changes, and so forth of the Cell. In particular, this information could include, for example and without limitation, current-voltage related information, supply voltages related information, and so forth.

The energy and power information contained in a Cell (for example, the information described above in conjunction with [cell_4]) may be, for example and without limitation, a set of expressions each of which specifies how much energy is released or power is dissipated when a particular set of events or values occur on signals of the Cell. Such expressions are variously referred to, for example and without limitation, as Energy Arcs and Power Arcs. In particular, an Energy Arc typically includes two types of information: an Event Arc and an EValue. An Event Arc is an expression of signal events that specifies signal transition values and conditions that need to be satisfied to release the energy given by the EValue (as a result of such changes in the signals). For example, when expressed in the ALF language, the Event Arc "01A−>01Y" specifies an event sequence in which signal Y goes from a 0 value to a 1 value after signal A goes from a 0 value to a 1 value. In some cases, this event sequence may be thought of in the following manner: "as a consequence of changes in A from 0 to 1, Y changes to 1 from 0". EValue is a representation of the amount of energy "released" by the Energy Arc when the Event Arc has been satisfied. EValue may be a single value or it may be a set that includes a multiplicity of values. For example and without limitation, EValue may be a triplet of values that represent cases where the manufacturing process can vary to provide: EValue.1 (a highest value); EValue.2 (a typical or most likely value); and EValue.3 (a lowest value). It is well known in the semiconductor industry to have such triplet values in many types of data other than energy data such as, for example and without limitation, propagation delays of circuits. Note, most embodiments described herein do not require EValue to be an actual value. Instead, EValue may be proxy for an actual value, which actual value may be supplied when the power requirement is determined in the manner described below. In addition, and as will described in detail below, the values derived from multiple EValue sets may be selected in response to user input or they may be selected in response to a system parameter. For example and without limitation, a system parameter may specify the use of EValue.2 (typical value), EValue.1 (highest value), or EValue.3 (lowest value).

A Power Arc typically includes two types of information: a Condition Arc and a PValue. A Condition Arc is an expression of signal conditions (such as, for example and without limitation, a Boolean expression) that, when satisfied, causes power to be dissipated until that the signal conditions are no longer true. For example, signals C and D in the Boolean expression "C & !D" provide a condition of logic value 1 for signal C and logic value 0 for signal D to satisfy this Condition Arc. PValue is a representation of the power dissipation by the Power Arc when the Condition Arc is kept satisfied. PValue may be a single value or it may be a set that includes a multiplicity of values. For example and without limitation, PValue may be a triplet of values that represent cases where the manufacturing process can vary to provide PValue.1 (a highest value); PValue.2 (a typical or most likely value); and PValue.3 (a lowest value). Note, most embodiments described herein do not require PValue to be an actual value. Instead, PValue may be a proxy for an actual value, which actual value may be supplied when the power requirement is determined in the manner described below. In addition, and as will be described in detail below, the values derived from multiple PValue sets may be selected in response to user input or they may be selected in response to a system parameter. For example and without limitation, a system parameter may specify the use of PValue.2 (typical value), PValue.1 (highest value), or PValue.3 (lowest value).

To help further understand the nature of Energy Arcs and Power Arcs, consider the following Event Arc in an Energy Arc (when expressed in the ALF language): "01 P−>10 Q & R=1;" where P, Q, R are signals in the Cell and "&" means a logical "and" operation. Note, that in contrast to Event Arcs in Energy Arcs, Condition Arcs in Power Arcs only specify static signal conditions, such as "K" or "K=1." As a result, it may be possible, for example and without limitation, to satisfy this Energy Arc and this Power Arc by having sets of consecutive values on signals to be "0111"; "1111"; "1011" in the order of "PQRK".

Circuit Design Representation: A circuit design may be represented at any level, i.e., at any level that is suitable for manipulation by software such as, for example and without limitation, at a gate level, at a logical level, at a transistor level, at a switch level, at a register transfer level ("RTL"), at a behavior level, at a combination of any of the above, and so forth. In addition, a circuit design description can be represented in any form, i.e., in any suitable format that a computer program can process such as, for example and without limitation, in Verilog, VHDL, ALF, EDIF, or in any other suitable Hardware Description Language. In further addition, Cells (for example and without limitation, Cells that represent hierarchical embedded structures, or Technology Library Cells) can be represented in any form, i.e., in any suitable format that a computer program can process such as, for example and without limitation, in Verilog, VHDL, ALF, EDIF, any proprietary format such as, for example and without limitation, lib, and so forth. Lastly, as is well known, a typical circuit design may include information such as, for example and without limitation, circuit signal information; Cells that may include, for example and without limitation, descriptions of the functional behavior of signals and the Cell, and one or more Energy Arcs, and one or more Power Arcs; and so forth.

Overview:

In accordance with one or more embodiments of the present invention, a stimulus data set is generated that approximates worst-case average power dissipation scenarios for an entire circuit design or for portions of the circuit design. Note that the terms circuit or circuit design are used interchangeably herein.

In accordance with one or more such embodiments of the present invention, a stimulus data set is generated (as will be described in detail below) using one or more of power and energy information, and functional behavior information contained in, for example and without limitation, Cells used in the circuit design, and/or Macro Activity Models (to be described in detail below), and/or user input. For example and without limitation, in accordance with one or more embodiments of the present invention, if Cells used in the circuit design do not contain such power and energy information, and functional behavior information, or if the Cells contain only some of such information, then such power and energy information, and functional behavior information or a missing portion of such information can be provided by user input, for example and without limitation, in separate files (for example and without limitation, using a Cell name and signal names using the same format as if that information were available inside the Cell itself).

As will be described in detail below, in accordance with one or more embodiments of the present invention, the stimulus data set comprises stimulus segments that are generated using circuit states, which circuit states are generated using Energy Arcs and Power Arcs. The stimulus segments comprise signal values and clock pulses that are generated by back-tracing or back-propagating the circuit states using circuit connectivity and the functional behavior of the circuit design (as will be described in detail below). Finally, the collection of stimulus segments, i.e., the generated signal values and clock pulses, constitute the stimulus data set, which stimulus data set may be written, for example and without limitation, into storage as a Stimulus Data file.

In accordance with one or more embodiments of the present invention, the circuit design is exercised in a simulation environment by applying the stimulus data set to create an Activity Data file using circuit signals and Energy Arcs and Power Arcs. Lastly, in accordance with one or more embodiments of the present invention, software programs calculate power estimates using the Activity Data file or the Stimulus Data file.

In accordance with one or more embodiments of the present invention, a user may optionally input circuit-specific control information regarding the functional behavior of a circuit design such as, for example and without limitation: which signals are clock signals; the frequency of clock signals; their relationship to each other, if any; which signals are operating mode control signals; circuit reset or mode-setting sequences; and so forth. Note that clock domains, as used herein are circuit segments or portions that are controlled or triggered by various clock signals. For example, when a clock signal Fclk affects circuit block C, then Cells in block C are said to belong to clock domain Fclk. If more than one clock signal affects a circuit block, the circuit block is said to belong to the clock domain of each of them. In addition, a clock signal and all clock signals derived therefrom are considered to form the same clock domain. For example and without limitation, clock signals may be derived from a clock signal as follows. Assume that Eclk is an externally supplied clock signal for a circuit, and that Eclk is used to derive three internal clock signals: (a) clk0 (whose frequency is the same as that of Eclk); (b) clk1 (whose frequency is one half of that of Eclk); and (c) clk2 (whose frequency is one quarter of that of Eclk).

In addition, in accordance with one or more embodiments of the present invention, a designation of a portion or portions of the circuit to be analyzed may be based, for example and without limitation, on user input control signal specifications. Such a control signal specification may be for example and without limitation, specification of a logic value 1 on a particular signal that selects circuit block A and makes circuit block B inactive depending on whether the circuit is processing 16-bit wide input data or 32-bit wide input data. As a consequence of such a control signal specification, if the particular signal is set to a logic value 1 during a particular application of one or more embodiments of the present invention, only a portion of the circuit design will be involved because circuit block B cannot be operable.

In accordance with one or more embodiments of the present invention, a user may input Macro Activity Models that are useful in dealing with large Cells referred to as "Macro Cells" (as will be described in detail below) such as, for example and without limitation, embedded memories and processors. A Macro Activity Model is preferable for dealing a Macro Cell because of its ability to model dominating activities of a Macro Cell in a circuit design. This can be understood as follows. Energy Arcs in Cells release a certain amount of energy when their event conditions are satisfied, and in most Cells, the amounts of energy represented by Energy Arcs are more or less of the same order of magnitude. In addition, Power Arcs in Cells dissipate a certain amount of power when their conditions are kept satisfied, and in most Cells, the amounts of power represented by Power Arcs are more or less of the same order of magnitude. However, for Macro Cells, certain signal activities are energy intense, and Energy Arcs and Power Arcs corresponding to such activities may contain energy and power levels of much higher orders of magnitude than those in an average Cell. In addition, a typical or a worst-case power dissipation application may exercise such Macro Cells in a regular pattern throughout the operation of the circuit, thereby releasing a high level of energy due to activities in Energy and Power Arcs having high energy and power levels. By contrast, a Macro Activity Model provides a mechanism for expressing and modeling the typical or the worst-case power dissipation of a Macro Cell during circuit operation. It should be noted that a Macro Activity Model provides additional information to that found in a Cell, and as such, a Macro Activity Model is not a substitute for the information typically found in a Cell. In addition, it is further noted that a Macro Activity Model can be expressed for any Cell, not just for large Cells. For example and without limitation, in a Macro Activity Model, a user may define how frequently a particular Macro Cell instance (an embedded structure in the circuit design) is accessed, and what operations are performed at such access times. For example, data may be written to a RAM in every $10^{th}$ clock cycle, and stored data may be read every $5^{th}$ clock cycle in a typical or a worst-case power dissipation application. In accordance with one or more embodiments of the present invention, a Macro Activity Model may be specified in terms of sets of signal values on a boundary of the Cell, and how often such signals are active. As such, a Macro Activity Model can be specified as, for example and without limitation, "Cell name, activity frequency in terms of once in so many cycles, and signal/value pairs." For example, and without limitation, for a RAM Cell such a Macro Activity Model may be specified as "RC 4 WE/1 CS/1 TS/0" where the Cell instance RC is expected to be active once in every four cycles with its WE, CS, and TS signals having values set forth therein. According to this Macro Activity Model, this combination of signal/value pairs should result in a high energy level compared to Energy or Power Arcs in an average Cell in the circuit design.

In accordance with one or more embodiments of the present invention, sets of values for signals in the circuit design are derived (as will be described in detail below) using Energy and Power Arcs in the Cells, and using Macro Activity Models supplied, for example and without limitation, by user input. In particular, a set of targeted Energy and/or Power Arcs is selected (as will be described in detail below), and a set of circuit states corresponding to the set of targeted Energy and/or Power Arcs is generated (as will be described in detail below), such circuit states being a set of known values on signals in the circuit design. Next, using circuit connectivity and the functional behavior of the circuit design, the circuit states are back-traced or back-propagated, one simulation clock cycle at a time until a "start" back-trace state is reached (as will be described in detail below). This generates a stimulus segment, i.e., a data set that includes the start state and back-trace data at each simulation clock cycle of the back-trace. As is well known, the back-trace data at each simulation clock cycle represents external inputs of the circuit design. Next, the start state is simulated using the stimulus segment. All Energy and Power Arcs (or any other type of arcs in the design such as, for example and without limitation, current-voltage information, signal delay information, and so forth) in the circuit design that are satisfied at each clock cycle for this simulation (using this stimulus segment) as well as switching activities of the signals are recorded at each clock cycle in an Activity Data file. It is important to note that in accordance with one or more embodiments of the present invention, a start state is assumed to exist under a simulation environment even though in the actual manufactured device such a state cannot be achieved instantly without applying more stimulus data prior to that state along with a progression of time. However, in accordance with one or more embodiments of the present invention, stimulus data sets are created by forcing the start state on the circuit design in the simulation environment, thereby making stimulus data more compact.

In accordance with one or more embodiments of the present invention, EDA tools may be utilized to analyze the Activity Data file to calculate an estimate of power dissipation in accordance with any one of a number of methods that are well known to those of ordinary skill in the art. Alternatively, the collection of compact stimulus segments may be written into a Stimulus Data file so that an optional simulation can be made for the same circuit design using other EDA tools, and for any detailed analysis of certain portions of a circuit design, or simulation segments to explore, for example and without limitation, peak switching activity for peak power estimations, if so desired.

Advantageously in accordance with one or more embodiments of the present invention, it is believed that substantially all areas of the circuit design are exercised so that switching activities are provided for the entire circuit design or portions thereof depending, for example and without limitation, on user input. Further, in accordance with one or more embodiments of the present invention, the use of Energy and/or Power Arcs from Cells enables circuit segments that have not been exercised previously to be identified and targeted to enable a substantially uniform distribution of switching activities throughout the circuit design. However, it is believed that the compact nature of the stimulus segments generated in accordance with one or more embodiments of the present invention makes signals go through a concentrated level of switching activities that exceeds the average dynamic power that may be generated under any typical application of the device. In addition, it is also believed that the compact nature of the stimulus segments generated in accordance with one or more embodiments of the present invention also enables efficient use of computational resources, even on large circuit designs. In further addition, internal accumulation of average switching data on signals eliminates a need to write large data files. Lastly, the use of Macro Activity Models for large and high energy dissipating Cells in accordance with one or more embodiments of the present invention is believed to be advantageous because it provides that the power such Cells would dissipate in a typical application is no more than that estimated for such Cells, and that the rest of the circuit undergoes switching activities consistent with activities and behaviors of such Cells during the power estimation process.

Figure 4:
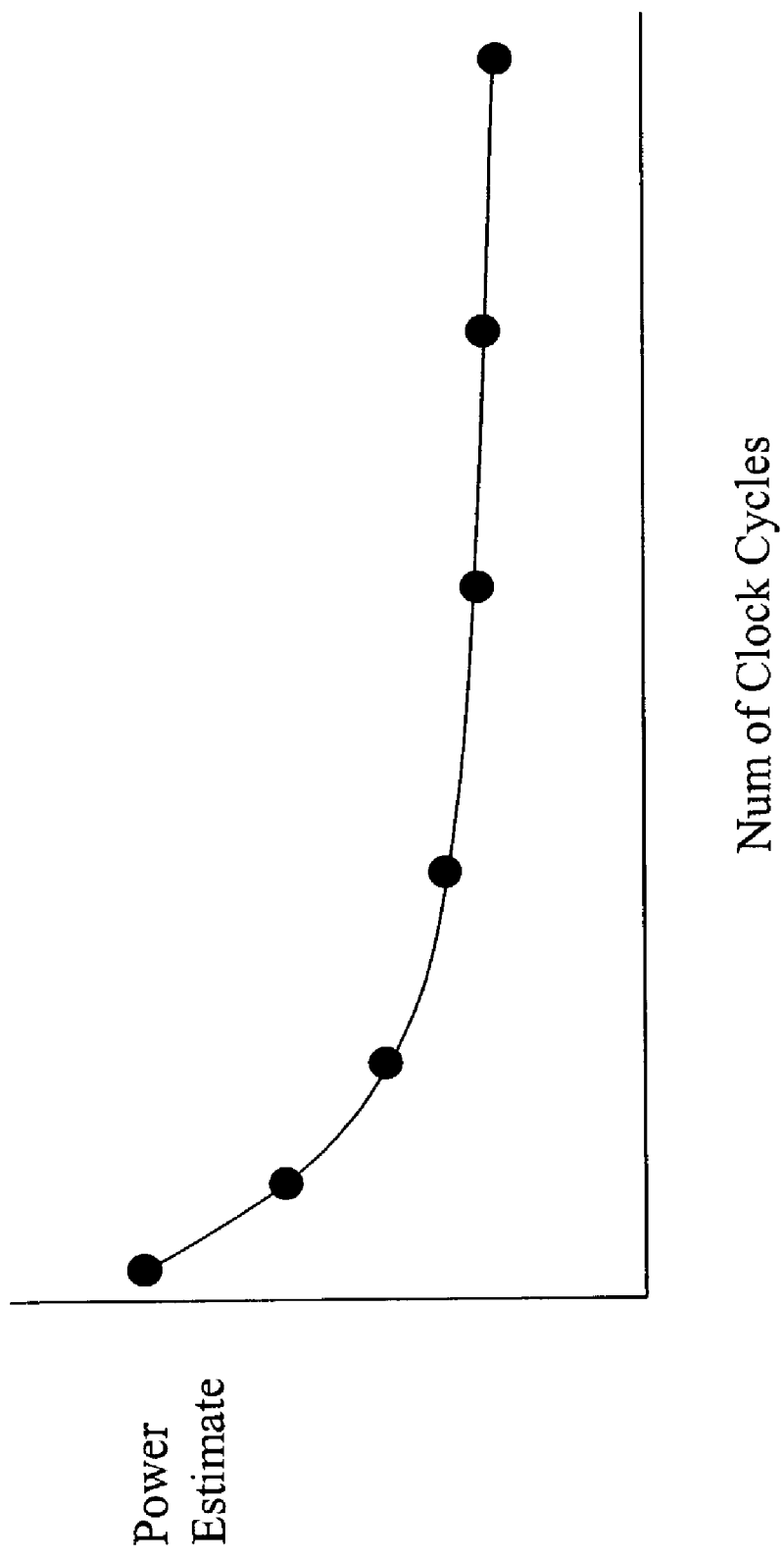
FIG. 4 shows a graphical representation of power dissipation estimate versus a simulation clock cycle limit in a stimulus segment obtained in accordance with one or more embodiments of the present invention.

In accordance with one or more embodiments of the present invention, as the number of simulation clock cycles in stimulus segments gets larger, it is believed that the estimated power dissipation gets closer (i.e., converges) to the actual dynamic power consumption of the circuit or its manufactured device. For example, FIG. 4 shows a graphical representation of power dissipation estimate versus a simulation clock cycle limit in a stimulus segment obtained in accordance with one or more embodiments of the present invention. As one can readily appreciate from FIG. 4, a reasonable estimate of power has been achieved when the curve starts to become almost horizontal. In accordance with an alternative embodiment of the present invention, a user could limit the number of simulation clock cycles in stimulus segments to be close to three (3) (for example, this allows a sufficient number of simulation clock cycles to be created to enable satisfaction of Event Arcs in complex Energy Arcs which may sometimes require two or more value transitions), and accept the power estimates to be an upper limit of worst-case power dissipation of the circuit. This reduces computation time, among other advantages.

FIG. 1 shows a flow chart of a method for estimating power requirements of a circuit design that is carried out in accordance with one or more embodiments of the present invention. The steps identified by the various boxes shown in FIG. 1 are implemented using software programs or modules that run on a processor such as, for example and without limitation, a general-purpose computer. Such software modules will be referred to herein as Electronic Design Automation Software ("EDA Software") because of their intended usage in Electronic Design Automation. As one of ordinary skill in the art can readily appreciate, one or more software programs or modules may carry out one or more or all of the steps identified by the various boxes shown in FIG. 1. In addition, as one of ordinary skill in the art can readily appreciate, there may be many ways to implement the steps described herein. For example, some steps may be carried out by separately run software modules, or all the steps may be carried out by a single program or module. In the following, the term software module is used to indicate, for example and without limitation, a complete software program, or a piece of a software program that is integrated into a larger program which may or may not be operable as a standalone program. In addition, the data already processed and the data being processed may be kept in memory or it may be written to a file that is stored on a storage device such as, for example and without limitation, a disk and used as needed in accordance with any one of a number of methods that are well known to those of ordinary skill in the art to implement the various steps.

It is convenient here to define a few categories of Cells that are mentioned in the following discussion: (a) Sequential Cells (as is well known) are Cells that are capable of holding some data values unchanged between clock pulses, even if values on signals coming into the Cell may change; and (b) Combinational Cells (as is well known) are Cells that are non-sequential in their signal behavior. Most of the time Cells with Macro Activity Models are Sequential Cells, however, Combinational Cells may also have Macro Activity Models, particularly if they are large and complex.

As shown in box 100 of FIG. 1, a software module (in a step that is typically referred to as compilation) processes the input circuit design to translate the information from the circuit design (including Cells) into a format that is adapted for manipulation by computer software modules. As is known, this is done because circuit design information (including Cells) is typically specified and described in a human readable format, which human readable format is in many cases not readily suitable for manipulation by computer software modules. In addition, at this initial processing step, the software module may check that sufficient information is available for the following processing steps, and the software module may perform data validity checks.

In accordance with one or more embodiments of the present invention, the software module creates a representation of the circuit design, including any Cells used therein, and relevant portions of their data (as was set forth above, Energy and Power Arcs and/or associated information used to evaluate power/energy dissipation may be embedded in Cells, or they may be supplied by some other means such as, for example and without limitation, by user input (for example, a separate file containing Cell names and Energy and Power Arcs)), in a form that is readily manipulated by software modules in accordance with any one of a number of methods that are well known to those of ordinary skill in the art (for example and without limitation, those who have developed EDA tools) to obtain a representation of the circuit and relevant Cell data in a form that software modules can manipulate. During this step, restrictions to portions of the circuit design upon which the estimates are based may be made by user input based on, for example and without limitation, control signal specifications. In addition, the user may input Macro Activity Models. In further addition, the user may optionally input circuit-specific control information regarding the functional behavior of the circuit design such as, for example and without limitation, which signals are clock signals, the frequency of clock signals, which signals are mode control signals, circuit reset or mode-setting sequences, and so forth. Thus, in accordance with one or more embodiments of the present invention, each signal in the circuit design is represented in internal data structures of the software module that carries out this step, and logic function models of the Cells may be: (a) expressed in ALF language constructs inside Cells; (b) provided as a separate set of information (for example, a separate input file supplied by user input) corresponding to particular Cells used; and/or (c) represented using any one of a number of methods that are well known to those of ordinary skill in the art for providing a suitable internal representation of a circuit design and its associated Cells. Control is then transferred to box 200 of FIG. 1.

As shown in box 200 of FIG. 1, a software module selects a subset of targeted Energy and/or Power Arcs (from the totality of Energy and Power Arcs provided in the step described above in conjunction with box 100 of FIG. 1). As will be described in detail below, the subset of targeted Energy and/or Power Arcs is then used to generate a stimulus segment. The following describes how to select a subset of targeted Energy and/or Power Arcs in accordance with one or more embodiments of the present invention.

In accordance with one or more embodiments of the present invention, a software module selects a single Cell (called a Seed Cell) from a subset of the totality of Cells (provided in the step described above in conjunction with box 100 of FIG. 1). Each Cell of the subset has an Energy and/or Power Arc that: (a) has not been previously been included in a subset of targeted Energy and/or Power Arcs; or (b) has not been satisfied by simulation of any previously generated stimulus segment (as will be described in detail below). In accordance with one or more embodiments of the present invention, the Seed Cell may be arbitrarily chosen, for example and without limitation, it may be chosen randomly.

Next, let W be an integer parameter that is correlated to the number of stimulus clock cycles in a stimulus segment (as will be described in detail below). In accordance with one or more such embodiments of the present invention, W is set to the maximum number of stimulus clock cycles for a back-trace, with additional provisions being made (as will be described below) for the number of stimulus clock cycles that are required for value transitions in Energy Arcs. The number of stimulus clock cycles required for value transitions in Energy Arcs may vary from a single stimulus clock cycle to a multiplicity of stimulus clock cycles, however, an average may be two stimulus clock cycles (i.e., some Energy Arcs may require only two (2) stable states for their satisfaction together with additional transitional states which are unstable). For example, a Cell containing a single "and" gate with inputs A, B and output Y may have an Energy Arc with its Event Arc as "01A->01Y". Setting "AB "to" 01" value, and then changing A "to" 1" may satisfy this event condition. However, "ABY" may undergo three state transitions "010", "110", "111" of which "110" is unstable. Thus, in accordance with one or more such embodiments of the present invention, W is set to the larger of the maximum number of stimulus clock cycles minus two (2), and two (2). In accordance with one or more embodiments of the present invention, the maximum number of stimulus clock cycles for the back-trace may be a system parameter and/or it may be changed in response to user input.

Alternatively, W can be set in response to user input directly, or it can be a function of other circuit design parameters such as, for example and without limitation, placement of Sequential Cells, placement of non-Sequential Cells or Combinational Cells, and connectivity among Sequential Cells and non-Sequential Cells. For example, W can be taken as an average shortest Cell-distance among Sequential Cells, multiplied by a factor (the meaning of Cell-distance is described in detail below). In accordance with one or more embodiments of the present invention, the average shortest Sequential Cell-distance may be calculated as follows. Place all Sequential Cells initially in a list, SL. Take one Cell, Ci from SL, and find the closest Sequential Cell, Cj for it. Record that Cell-distance Di, and remove both Ci, and Cj (if Cj is in SL) from SL. Obtain the average of Di values. The multiplicative factor may be a small constant value, such as, for example and without limitation, 1, 2, 3, or 4, or it may be a property of the circuit design itself such as, for example and without limitation, the ratio of the number of non-Sequential Cells to the number of Sequential Cells in the circuit (ratio rounded to nearest integer).

Next, in accordance with one or more embodiments of the present invention, starting with the selected single Seed Cell, the software module selects more Cells in the circuit such that the next Cell selected is W Cells away from one or more Cells in the selected set thusfar, but not any closer than W Cells to any Cell in the selected set thusfar. Two Cells are considered adjacent if a signal in one Cell can drive a signal in the other. For example, if (a) Cells c0 and c1 are adjacent, (b) Cells c1 and c2 are adjacent, but (c) Cells c0 and c2 are not adjacent, then Cell c2 is said to be 2 Cell-distance away from Cell c0. In other words, Cells c2 and c0 are 2 Cell-distances away. Likewise, another Cell c29 may be connected to c0 via Cells c8, c12, and c76 as: c29 is adjacent to c8, c8 is adjacent c12, c12 is adjacent to c76, and c76 is adjacent to c0. Then it can be said that Cell c29 is 3 Cell-distances away from Cell c76. This procedure is carried out considering all Cells in the circuit design. As a result, the software module provides a set of Cells (referred to as a W-neighborhood of Cells) where each Cell in the W-neighborhood is W Cell-distances away from its nearest neighbor Cell. It is also possible to start with multiple Seed Cells, and to continue collecting more Cells to build a W-neighborhood.

Next, from each Cell in the W-neighborhood, the software module selects one unsatisfied Energy or Power Arc as follows: The selection of the unsatisfied Energy or Power Arc can be made, for example and without limitation, from a list of Energy and Power Arcs kept for each Cell using linear search methods or using a random selection method; a random selection method for the unsatisfied Energy or Power Arc in each Cell is preferable. In accordance with one or more alternative embodiments of the present invention, it is possible to select one among the satisfied Energy or Power Arcs, if all Energy and Power Arcs in a Cell have been satisfied and the Cell is a non-sequential Cell, or to select none if it is a Sequential Cell.

In accordance with one or more alternative embodiments of the present invention, the selection of the W-neighborhood can be carried out by considering only Cells having an Energy or Power Arc that has not been selected before by this method, or that has not been satisfied previously during the simulation of stimulus segments created earlier. It should be noted that Energy or Power Arcs should be selected in such a way that their signal values and conditions do not conflict with certain signal value settings of the circuit that are required for proper circuit operation. For example, without limitation, a control signal (such as a reset signal) may be required to have a value 0 for a portion of, or for the entire, circuit to function. Such control signals may be specified and values provided by the user, or a software module may be able to derive such information using circuit analysis. If a Power Arc is selected from a Cell that requires a value 1 on that control signal, the Power Arc cannot be satisfied under the conditions. Therefore, such Power or Energy Arcs may not be selected from W-neighborhood Cells to be targeted Power or Energy Arcs.

In accordance with one or more alternative embodiments of the present invention, the single Seed Cell may be selected only among Sequential Cells or among Cells with Macro Activity Models. In accordance with one or more further alternative embodiments of the present invention, the single Seed Cell could be selected only among non-Sequential Cells. In accordance with one or more further alternative embodiments of the present invention, one may select more than one Seed Cell using a selection criteria that is a function of, but not limited to, (a) how many Sequential and non-Sequential Cells are in the circuit, (b) the number of Cells in different clock domains, (c) the number of Cells that have the lowest percentage of satisfied Energy and/or Power Arcs (numbers of both types of Arc can simply be added to get the total count if both types are considered for developing a target set) in each clock domain. Percentages may be calculated based on a total number of Energy and/or Power Arcs in the entire circuit, the number of Energy and/or Power Arcs within each Cell from which the Arc is selected, or the total number within each clock domain. For example, one Sequential Cell at random can be selected from each clock domain to be a Seed Cell. In accordance with a further embodiment of the present invention, one may select one Sequential Cell from each clock domain with an additional number "P" non-Sequential Cells when "P" is greater than 1, where "P" is a ratio (fractions may be discarded, and only the integer value taken) of non-Sequential Cells to Sequential Cells in the circuit. In accordance with one or more further alternative embodiments of the present invention, one may select from each clock domain a Cell that has the lowest percentage of Energy and/or Power Arcs satisfied so far. Then, using the Seed Cells, one may select the W-neighborhood Cells using any of the methods described above.

In accordance with one or more further alternative embodiments of the present invention, another method of selecting a set of Energy and/or Power Arcs from a given W-neighborhood Cells, is the following. First, calculate the energy in PValues of Power Arcs in each Cell in the W-neighborhood Cells that would dissipate if they were to be kept satisfied for the duration of cycle time length of the clock that would affect the Cell by considering the clock domain affecting that particular Cell. If more than one clock is affecting the Cell, for example and without limitation, the average clock cycle time lengths of only those clocks is taken. If it is not possible to identify a clock domain (i.e., clocks that affect the Cell), it is possible to consider the average clock cycle time length of some or all known clock signals of the circuit for this energy calculation for such Cells. This average clock cycle time length can be obtained by taking the average cycle times of the clock signals specified for the circuit. These calculated energy values from PValues are referred to as CEValues for convenience of explanations below. In the following steps, it is assumed that Event Arcs are not satisfied more than once in a given clock cycle, which is mostly the case. Next, use these CEValues and EValues in Energy Arcs to rank Power Arcs and Energy Arcs in each Cell of the W-neighborhood Cells —from highest energy dissipation to lowest (these calculations can be done approximately to reduce the computational time). Next, select the Energy Arc or Power Arc with the highest EValue or CEValue value from each Cell of the W-neighborhood Cells. If these selected Energy or Power Arcs coincide with Energy or Power Arcs that correspond to user specified operations in Cells with Macro Activity Models, then such Energy or Power Arcs can be ignored from further consideration in this selection process in order to reduce any undue influence from such Cells on the final power estimated.

In accordance with one or more further alternative embodiments of the present invention, to reduce any undue influence of a few Cells with high EValues and/or PValues on the final power estimated, the following method can be implemented even when Macro Activity Models have not been specified for such Cells. Rank the Energy and Power Arcs in each Cell of the W-neighborhood Cells—from highest energy dissipation to lowest—using EValues and CEValues (CEValues are calculated as explained above). Next, find an energy threshold value such that more than a large fraction of CEValues and EValues fall below that threshold value. For example, at an energy threshold value Et for CEValues and EValues, at least 90% (a fraction selected for this example) of CEValues and EValues (combined) fall below Et. Now consider only those Energy and Power Arcs that fall below Et in W-neighborhood Cells to be selected.

In accordance with one or more further alternative embodiments of the present invention, it is possible to apply certain concepts from other algorithmic techniques such as "genetic algorithms" in selecting a set of targeted Energy or Power Arcs. The same parameter W used in W-neighborhood Cell selection method described above can be utilized here as well. Collect all the Energy and Power Arcs by eliminating those that cannot be satisfied due to control signal settings in the circuit or by analysis of the circuit design by a software module as was explained elsewhere. For Power Arcs, calculate CEValues (as explained elsewhere, this is the energy that would be dissipated by the PValues of Power Arcs for one clock cycle time period or for one average clock cycle time period). Define a parameter K such that if W<2, K=2, else K=W. Alternatively, K can be set to be K=W+1. Define a parameter N to be the ratio of "total number of all types of Cell instances in the circuit" to K. Alternatively, N could be chosen as, for example and without limitation, the number of Sequential Cells of the circuit design. N represents the initial population size of Energy and Power Arcs are to be selected. The selection method starts with a randomly selected N number of Energy and/or Power Arcs. Both Energy and Power Arcs are considered, for example and without limitation, to be in a single candidate set regardless of their different types for these selections. In the set N, referred to herein as Set_N, if more than one Energy and/or Power Arcs are from a single Cell, discard others and keep the one with highest energy (consider EValue or CEValue, for example, if EValue is higher keep the appropriate Energy Arc). To reduce computational time, it is desirable to set a limit on the number of iterations of the following steps, for which a parameter R is defined. If W>10, R=10, else R=W. The following steps are repeated R times and the final set of Energy and/or Power Arcs are taken as the target set.

The steps are as follows. By randomly selecting two elements at a time, pair the elements in Set_N. Each element is chosen only once, except when N is an odd number. This leads to having N/2 pairs, or N/2+1 pairs. If N is an odd number, allow one previously chosen element to be paired with the left over element. This new set is named Set_P, which represents, for example and without limitation, the parent set of population in this scheme. Empty the Set_N at this point. Consider each pair in Set_P, and calculate the average energy, using EValues and/or CEValues of the two elements in the pair, which can be labeled as E1, and E2 for convenience. For E1, find a Cell adjacent to the Cell of E1, which has a suitable Energy or Power Arc whose EValue or CEValue is higher than the average energy thus calculated from E1 and E2. If found, that Energy or Power Arc is placed in Set_N. If the search fails, E1 is placed in Set_N. Repeat the same for element E2. The above steps are repeated with the new elements in Set_N, controlled by parameter R.

Set_N contains the Energy and/or Power Arcs to be the targets of the start of a creation of a new stimulus segment in accordance with one or more embodiments of the present invention. There can be many variations and refinements of these steps of the above-described genetic algorithm, which could include considerations of Sequential and non-Sequential Cells, different clock domains, and so forth.

Note, one might assume that using a small value for W might cause a large number of targeted Energy and/or Power Arcs to be selected in this step, and that this might result in a much higher estimate of power dissipation than would otherwise be the case if W were a large value. However, it is believed that this is not the case because satisfaction of Energy and/or Power Arcs requires particular values on circuit signals, and this means that only a sub-set of the Energy Arcs and/or Power Arcs can be satisfied at any given time. As a result, it is believed that this reduces the number of Energy and Power Arcs that would actually dissipate energy to a level that is consistent with the circuit design itself, regardless of whether the value of W is low, for example and without limitation, a value less than 10. Therefore, in accordance with one or more embodiments of the present invention, variation of the value of W may affect the final power estimate value by a small factor or a margin, and as a result, any low value for W is suitable. On the other hand, regardless of the value of W, deterministic backtracing the circuit design to determine satisfaction of any number of Energy and/or Power Arcs makes the circuit design go through effective circuit state transitions (when simulated with the thusly created stimulus segment). Therefore, any value of W, ranging from a small integer to infinity (i.e., corresponding to selecting only one Cell) are practical, and would provide useful power estimates when combined with a low value, such as but not limited to 5, for the simulation clock cycle limit in the stimulus segments. That the variation of estimated power based on the value of W is limited to a small factor has been established empirically for various circuits.

As was described above, it is preferable to use a Macro Activity Model for large Cells such as RAMs, design cores, and so forth that normally have high value Energy or Power Arcs to avoid selecting high value Energy or Power Arcs from Cells that have been specified in the Macro Activity Models. In particular, selecting Energy and/or Power Arcs using the above-described W-neighborhood Cells and deterministically generating stimulus segments to satisfy their conditions (as will be described in detail below) would yield a high level of switching activity. Thus, the use of Macro Activity Models for appropriate Cells aids in estimating the energy dissipated by large Cells with high Energy and/or high Power Arcs to be no less than what the typical worst-case real applications would generate.

In accordance with one or more further alternative embodiments of the present invention, a software module selects a subset of targeted Energy and/or Power Arcs by partitioning the circuit design into several sections based on certain partition selection criteria. For example, the following are examples of partition selection criteria that may be used to partition the circuit design: (a) different clock domains; (b) design hierarchy modules in the circuit; (c) user-specified partitions; and (d) regions which can be formed based on how different operating modes affect the circuit, such as some circuit areas may shutdown, work slower, or be restricted for data based on certain signal settings.

Lastly, in accordance with one or more still further alternative embodiments of the present invention; a software module selects a subset of targeted Energy and Power Arcs using a combination of any of the above-described methods. Control is then transferred to box 300 of FIG. 1.

As shown in box 300 of FIG. 1, a software module processes the targeted Energy and/or Power Arcs (provided in the step described above in conjunction with box 200 of FIG. 1) to create a set of circuit states (referred to herein as Cst) in accordance with any one of a number of methods that are well known to those of ordinary skill in the art (for example and without limitation, those who have developed EDA tools to handle transition faults, delay path faults, CMOS faults, and many other types of applications). As is well known to those of ordinary skill in the art, such circuit states are a set of known values on signals in the circuit design. The software module may create 1, 2, 3 or more such required states based on variables and the Event Arc or Condition Arc in the Energy and/or Power Arc, respectively, and the software module stacks these required states into different simulation clock cycles in accordance with any one of a number of methods that are well known to those of ordinary skill in the art. As one can readily appreciate, satisfaction of Energy Arcs may require a group of signals to undergo a set of values in succession, while satisfaction of Power Arcs may not necessarily require such successive value transitions. However some of those value sets may be transitional values, and therefore, they may not be stable values of the signals in that group. It is advantageous for the software module to identify such transitional (unstable) states so that they do not form circuit states for other software modules to explicitly target for satisfaction during the subsequent stimulus generation process. However, knowledge of these unstable states may be useful in deriving the required stable states. In accordance with one or more embodiments of the present invention, the software module does not have to declare values on all signals in the circuit design to create a particular state Cst. However, taking the circuit design through the transitions of these Cst states is required to satisfy the selected set of targeted Energy and/or Power Arcs. When the circuit transitions through these states consecutively (the Energy Arcs are satisfied), the Energy Arcs represent the energy (or other features that one may select to target, such as, for example and without limitation, delay, current-voltage drop, and so forth) that the circuit designs would dissipate due to those signal and state transitions. Similarly Power Arcs, if satisfied would also dissipate energy, as they are held satisfied for time periods.

For large Cells that contain high value Energy and/or Power Arcs, the specified collection of Macro Activity Models, which was explained earlier, is considered at this point. The software module that embodies this step can select a subset from a list of Macro Activity Models for various Cells in the circuit design, depending on how often they ought to be active. This subset would generate required values for circuit signals thereby specifying additional values for circuit states to be achieved by the stimulus segments. These additional circuit state values are combined with already created circuit states (Cst's) to generate consistent circuit states. If any value conflict arises on a signal in trying to combine them, it can be resolved by giving preference to either side of a conflict, alternatively. Note that portions of the circuit states that were not obtained by satisfaction of the targeted Energy and/or Power Arcs may be selected randomly. After creation of the desired (target) circuit states, control is transferred to box 400 of FIG. 1.

As shown in box 400 of FIG. 1, a software module performs a back-trace or back-propagation of Cst states in accordance with any one of a number of methods that are well known to those of ordinary skill in the art (for example, EDA tool developers who deal with circuit analysis or test pattern generation tools), one simulation clock cycle at a time, in accordance with any one of a number of methods that are well known to those of ordinary skill in the art. In accordance with this embodiment, one Cst would lead to another while back-tracing in simulation time, thereby yielding required internal signal values at different simulation clock cycles, external input values, and clock signal values and waveforms. As is done in the practice of stimulus generation techniques, whether to select only one clock signal or more in each clock cycle during back-tracing can be made to depend on a user-specified preference. The user can optionally specify, for example and without limitation, which clock signals are allowed to be active concurrently in the same clock cycle, and which are not. Additionally a software module can analyze the clock signals and identify the common sources of derived clocks whenever possible, and utilize that information to identify which clocks can become active concurrently in the same clock cycle. External signal values and clock signal values are recorded as simulation stimuli at each simulation clock cycle (to form the stimulus segment), while internal signals are used for back-tracing to reach for the next circuit state in this back-tracing process. If multiple Cst's were created at the start due to the nature of selected Energy and/or Power Arcs or Macro Activity Models in step 300, they would be aligned with the newly derived circuit states (referred to as Cstn) during the back-propagation of required signal values in accordance with any one of a number of methods that are well known to those of ordinary skill in the art (for example, EDA tool developers who deal with circuit analysis or test pattern generation tools). During back-tracing, using typical search techniques, certain decisions made earlier about signal value assignments may be reversed, and as is well known to those of ordinary skill in the art, such reversals are termed backtracking. In accordance with one or more embodiments of the present invention, such reversals may be limited (for example and without limitation, in accordance with a system parameter and/or user input) so that computational time is reasonable. In addition, in accordance with one or more further embodiments of the present invention, if a reversal limit is reached before completion of required search activities at any time, a decision whether to accept the partial stimulus created thus far may be determined, for example and without limitation, on the basis of user input.

In addition, some Macro Activity Models may be selected based on their specified cycle frequency, and their signal/value pairs incorporated during the back-trace of circuit states. Note that in accordance with one or more embodiments of the present invention, each stimulus segment about to be generated has an upper limit for the number of simulation clock cycles allowed. Also, a cycle frequency parameter in each Macro Activity Model is compared with the total number of simulation clock cycles accumulated thusfar in all stimulus segments. This provides a decision of whether to incorporate a Macro Activity Model for a given cycle in the back-trace process. For example, if a Macro Activity Model with a frequency of 1-in-4 has already been active 46 times, and thusfar there are 200 total cycles of total accumulated stimulus data, then its signal/value pairs should be incorporated for satisfaction during back-tracing. These additional specified signal values would enlarge the value set of Cst states already specified in the step of box 300 of FIG. 1.

In accordance with one or more embodiments of the present invention, circuit signals that are not assigned a value during back-tracing may be assigned values using any one of a number of methods. For example, and without limitation, such circuit signals may be assigned a value: (a) randomly; (b) such that the average occurrence of the value 1 is the same as the average occurrence of the value 0 on signals; (c) so that additional Energy and/or Power Arcs of Cells connected to such signals are satisfied; and (d) so forth. In addition, such additional Energy and/or Power Arcs: (a) may be restricted to those already satisfied; (b) may be restricted to those never satisfied; or (c) may not be restricted at all. For example, consider Cell CAB having an internal signal set {A,B} and an Energy Arc set {(01A & B=1), (10A&B=0)}, and Cell CPRQ having an internal signal set {P,Q,R} and an Energy and Power Arc set {(01Q–>10R & P), (Q & !P)}. If a circuit signal K is connected to both B and P signals, and K has already been assigned value 1 during back-trace, then Energy Arcs (01A & B=1) and (01Q–>01R & P) can be selected since they agree with the assigned value of K. Some of these additional Energy Arcs incorporated into back-tracing along the way may be discarded if their requirements conflict with those of the originally selected Energy or Power Arcs. Also, it is possible to go back and re-select different additional Energy Arcs depending on the capacity of computational resources. It is believed that these additional Energy and Power Arcs considered during back-tracing to make a maximum (or close to maximum, or a high number allowed by the computing resources) number of Energy and/or Power Arcs satisfied at each simulation clock cycle tend to create simulation scenarios providing maximum sustaining circuit energy levels which can be considered to be worst case power dissipation levels in the circuit. Control is then transferred to decision box 410.

At decision box 410, a software module determines whether Cstn is an "initial" or "reset" state. An initial or reset state is a state of the circuit design that can be reached by simply simulating a sequence of stimuli provided by the designer of the circuit design such as, for example and without limitation, an "initialization" or "reset" stimulus, whose objective is to make the internal values of certain signals in the circuit design set to known values for proper operation of the circuit subsequently. In some circuit designs, an initial or reset state may be achieved by a single cycle signal change, or in some circuit designs it may take several thousand or more cycles. In some other circuit designs, a user may not specify such a sequence, and thus, in accordance with one or more alternative embodiments of the present invention, the initial state could be a state where no signal value is known. If Cstn is an initial state, control is transferred to box 600 of FIG. 1; otherwise, control is transferred to decision box 420 to continue back-tracing to generate stimulus clock cycles.

At decision box 420 of FIG. 1, a software module determines whether a user-provided maximum number of stimulus clock cycles for the back-trace has been reached. Alternatively, the maximum number of stimulus clock cycles may be a system parameter. In accordance with one or more embodiments of the present invention, the back-tracing may be terminated to yield a partial stimulus segment when other thresholds have been reached, wherein such other thresholds may be a system parameter or may be provided by user input. In accordance with one or more embodiments of the present invention, such other thresholds may be, for example and without limitation, how many decisions and re-decisions may be made during back-trace, how many signal values have been determined, how much computer resources have been used, and so forth. To reduce the burden on computational resources and to obtain results faster, it may be desirable to accept such partial stimulus segments. If the back-trace is terminated, control is transferred to box 500 of FIG. 1, otherwise control is transferred to box 400 to continue the back-trace.

As shown in box 500 of FIG. 1, the maximum number of stimulus clock cycles for the back-trace has been reached, and the last Cst in the back-trace has to be achieved by "forcing" values onto the circuit signals (only state elements which can be considered as data retaining signals are forced with values). The Cst state values are forced by directly injecting them onto the signals in accordance with any one of a number of methods that are well known to those of ordinary skill in the art (for example, EDA tool developers who deal with circuit analysis, simulation, or test pattern generation tools). Note that such a set of values may or may not be consistent with the functionality of the circuit design, or they may or may not be reachable in a real (i.e., manufactured) device. Control is then transferred to box 600 of FIG. 1.

Figure 2:
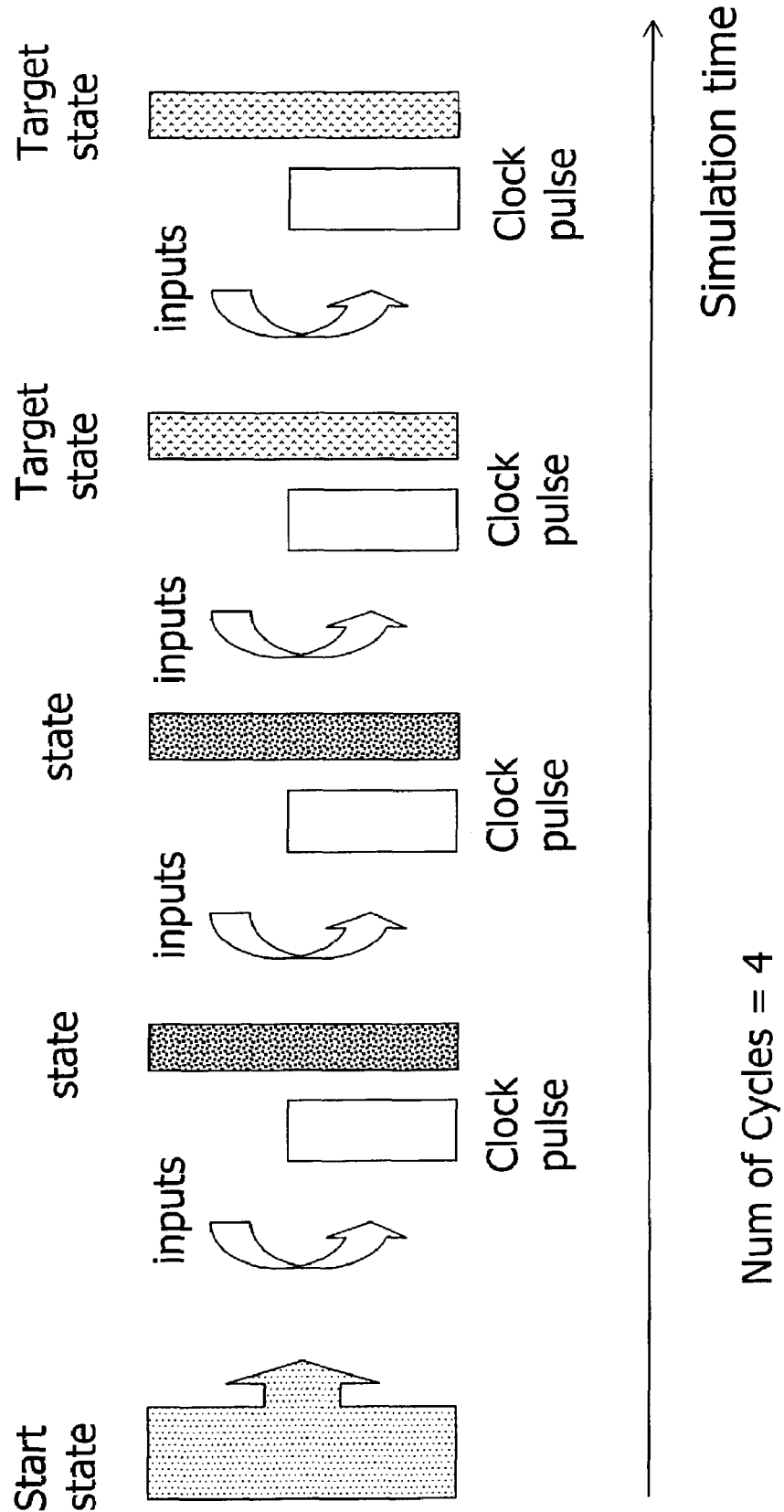
FIG. 2 shows a pictorial representation of a simulation time domain based progression of circuit state transitions when signal values on external inputs and clock signal pulses are applied using a stimulus segment in accordance with one or more embodiments of the present invention.

As shown in box 600 of FIG. 1, the stimulus segment is recorded in a Stimulus Data file. Next, a software module simulates the stimulus segment in forward "time" progression in accordance with any one of a number of methods that are well known to those of ordinary skill in the art (for example, EDA tool developers who deal with circuit simulations). FIG. 2 shows a pictorial representation of a simulation time domain based progression of circuit state transitions when signal values on external inputs and clock signal pulses are applied using a stimulus segment in accordance with one or more embodiments of the present invention. In accordance with one or more embodiments of the present invention, during the simulation of the circuit using stimulus segments, Energy and/or Power Arcs in Cells of the circuit design are checked to determine whether any of them becomes satisfied as signal values change. As set forth above, Energy Arcs are satisfied due to signal transition events. A software module collects data for Energy Arcs that shows how many times they have been satisfied. Power Arcs are satisfied when signals have particular values. As set forth above, this means their conditions can be held satisfied over a time period. For Power Arcs, a software module collects data indicating how long the Power Arcs remain satisfied during the simulation as a fraction of total time in all stimulus data segments, and also how many times they became satisfied. For example and without limitation, assume that Event Arc "01A–>01Y" of an Energy Arc was satisfied 6 times during the application of all stimulus segments of total length 100 time units (for example and without limitation, a time unit could be in nanoseconds, or in any other suitable unit). For such an example, data indicating how long the Energy Arc remained satisfied is 0, and data indicating how many times the Energy Arc was satisfied is 6. For example and without limitation, assume that Condition Arc "B & C" of a Power Arc was satisfied 12 times, and it remained satisfied for a total of 25 time units during the application of all stimulus segments of total length 100 time units. For such an example, data indicating how long the Power Arc remained satisfied is 0.25 (i.e., 25 divided by 100), and data indicating how many times the Power Arc was satisfied is 12. As will be discussed below in the step described in conjunction with box 700 of FIG. 1, this data is written to the Activity Data file. For each circuit signal, the following data is also written to the Activity Data file: the fraction of total stimulus time the circuit signal remained at logic value 1, the number of times the signal changed from logic value 0 to logic value 1, and the number of times the signal value changed from logic value 1 to logic value 0. For example and without limitation, if circuit signal "P" was at logic value 1 for 15 time units, changed from logic value 0 to logic value 1 18 times, and changed from logic value 1 to logic value 0 19 times, then (assuming a total time=50 time units), the data written would be (0.3, 18, 19) for this circuit signal. In accordance with one or more embodiments of the present invention, only Energy and/or Power Arcs, and circuit signals that have non-zero values are written to reduce the volume of data. In addition, in accordance with one or more embodiments of the present invention, one may also record circuit signal transitions to values other than logic value 0 or logic value 1 as valid logic value 0 to logic value 1 or logic value 1 to logic value 0 transitions as long as such transitions start or end with logic value 0 or logic value 1. For example and without limitation, a transition from logic value 0 to an unknown value may be counted as a logic value 0 to logic value 1 transition. In further addition, in accordance with one or more embodiments of the present invention, for computational efficiency, one may consider only Energy and/or Power Arcs that have not been satisfied thusfar rather than all Energy and/or Power Arcs in the circuit design, and also to discard any stimulus segment if it does not satisfy additional Energy and/or Power Arcs beyond what has been satisfied thusfar. Control is then transferred to decision box 610 of FIG. 1.

As shown in decision box 610 of FIG. 1, a software module determines whether any more Energy Arcs and/or Power Arcs are to be processed. If so, control is transferred to box 200 of FIG. 1, otherwise, control is transferred to box 700 of FIG. 1.

As shown in box 700 of FIG. 1, a software module generates an Activity Data file containing three (3) values for each signal in the circuit design: (a) the number of times the circuit signal changed from logic value 0 to logic value 1; (b) the number of times the circuit signal changed from logic value 1 to logic value 0; and (c) the total time the circuit signal had a logic value of 1 out of the total stimulus time written as a fraction. This can be viewed as a probability of the signal being at value 1 based on dynamic switching activities in the circuit. The Activity Data file also contains Energy and/or Power Arc data showing how many times each Energy Arc and/or Power Arc was satisfied during the simulation of all the stimulus segments. Optionally or alternatively, the step described in conjunction with box 700 of FIG. 1 can write all, or a portion of, the collection of stimulus data segments generated into a Stimulus Data file. In accordance with one or more embodiments of the present invention, the information to be written to the Activity Data file and the Stimulus Data file can be kept in internal memory of the software modules until they are written to storage such as, for example and without limitation, a disk. The software module may also write information reports relating to computer resources used and run time statistics to a file. In addition, in accordance with one or more further embodiments of the present invention, the software module could transmit the data to remote computing resources utilizing any one of a number of communication methods that are well known to those of ordinary skill in the art such as over the Internet. Control is then transferred to box 800 of FIG. 1.

As shown in box 800 of FIG. 1, a software module uses the data in the Activity Data file along with other EDA tools, or by itself, to evaluate the total energy dissipated and its average over total stimulus segment time to estimate the power dissipated in accordance with any one of a number of methods that are well known to those of ordinary skill in the art. In accordance with one or more embodiments of the present invention, actual values for EValue and/or PValue may be supplied at this point. In addition, such data may be used to estimate the peak power dissipation by evaluating power dissipation over a narrow window of cycles during the process of evaluating dynamic power dissipation. A further software module may use the stimulus sets of data, along with the circuit design, to analyze, study, model, or evaluate the activities, which may occur in the circuit or the design. Lastly, the data generated may be used for other estimations and studies such as current-voltage drop analysis, metal migrations, power rail parameter estimations, etc., related to semiconductor device design, fabrication and packaging.

Note that one or more embodiments of the present invention operate on circuit designs having circuit design descriptions that are different from the above-described circuit design descriptions that use, for example, Cells that contain behavior or functionally. In fact, one or more embodiments of the present invention operate on circuit designs that utilize different ways of describing the behavior and functionality of a circuit design, or on circuit designs wherein parts of the circuit design may use the same, or a different, methodology from the Cell based circuit design described above. (A Cell-based circuit, without limitation, can be viewed a collection of individual Cell instances interconnected using circuit signals). For example, one description of a circuit design may use Cells, another description of a circuit design may use only a simple behavior or functional description of the circuit design, and still another description of a circuit design may use a combination of these two descriptions. Thus, in addition to the embodiments described above, one or more embodiments of the present invention may be applied to circuit designs wherein some or all of the circuit design may be described at a high level (such as, for example and without limitation, an RTL level) that only describes circuit functionality (which may include logical behavior of signals, timing information such as propagation delays, and so forth) in contrast to a Cell based circuit design. Such portions of a circuit design, including the entire circuit, that do not correspond to identifiable Cells in the manner described above, can still be subjected to power estimation in accordance with one or more embodiments of the present invention with the help of Energy and/or Power Arcs as described in detail below.

The following describes an embodiment of method 1 for dealing with a circuit design at the RTL level. As is well known, at the RTL level, a circuit design basically provides the behavior of circuit signals. For example, the behavior of a signal inside a circuit design may be expressed in Verilog RTL as "assign Y=A & B;" where the circuit signals are Y, A, and B; and the value of signal Y is formed by an "and" operation of A and B signals. Signal A may also be formed by another "and" gate with input signals P and Q. As the circuit design and implementation progresses, presumably two Cells (for example, each of which is a Cell whose name is D1A2), each of which carries out this "and" operation, can be used to implement these two operations, or they may be combined and be represented by a different Cell (for example, a Cell whose name is D2A3). In the latter case, the signal behavior of Cell D2A3 is equivalent to the following Verilog RTL statement: "assign Y=P & Q & R;". In order to obtain Energy and/or Power Arcs corresponding to such circuit operations, a set of Cells containing the representative logic operations may be used. For example, Verilog RTL "&" signal operation in Verilog statement "assign Y=A & B;" may be considered to correspond to Cell D1A2 to enable this method to map Energy and/or Power Arcs in Cell D1A2 into signals A, B, and Y. Thus, signal behavior is provided by "assign Y=A & B;" while Energy and/or Power Arcs can be taken from Cell D1A2. In a similar fashion, operations in RTL, or in any other form, can be analyzed and identified to correspond to a basic set of Cells whose signal behaviors are known and for which Energy and/or Power Arcs are available. In accordance with one or more embodiments of the present invention, a user can provide a set of simple Cells containing Energy and/or Power Arcs corresponding to signals and their logical operations such as, for example and without limitation, "and", "or", "multiplexor", "not", and so forth. Then, a software module can obtain Energy and/or Power Arcs corresponding to signals and their logical operations ("and", "or", etc) as explained above. For example, the user can specify Cell D1A2 for an "and" operation, and the software module can use it for the Verilog RTL operation "&". Further, as one of ordinary skill in the art can readily appreciate, the functionality described in RTL enables back-tracing and simulation described above, while the Energy and/or Power Arcs are obtained by mapping operations into Cells provided, for example and without limitation, by the user. Alternatively, if such Cells are not provided, predetermined, built-in (i.e., default) Energy and/or Power Arcs may be used for RTL operations based on one or many case studies. Likewise, internal signal behaviors can be described in RTL in terms of other internal and external signals. RTL descriptions have many different description forms, statements, statement blocks, and so forth, all of which for convenience are termed here as RTL operations. As is well known to those of ordinary skill in the art, RTL operations can be analyzed and understood by software modules, so that their logical behavior can be represented by: (a) simple Combinational logic operations such as "not", "and", "or", "multiplex", and so forth; (b) Sequential logic operations such as "flip_flop", "latch", and so forth; or (c) a set of Complex logic operations such as memories (RAMs), and so forth. In some cases, certain RTL statements, statement blocks, and so forth, may be considered to consist of the above-identified logic operations, or may be processed further to simplify them based on known methods. For example, the RTL statement block "always@(A or B or C) if (A) Y=B; else Y=C;" can be interpreted to be "always@(A or B or C) multiplexor (Y, C, B, A);" or, as is well known to those of ordinary skill in the art, it may be further processed to be "or(Y,P,Q); and(P,A,B); and(Q,D,C); not(D, A);" where P,Q,D are new signals and the first signal in a simple logic gate is the output signal of that gate. In either case, in this example, the Energy and Power Arcs in Cells corresponding to such derived logic operations can be taken as the Energy and Power Arcs in that RTL statement block. It is possible to perform back-tracing in both the above cases.

Another example is the RTL statement block "always@ (posedge Rst or posedge Clk) if (Rst) G=0; else G=E;", which can be interpreted to be "always@(posedge Rst or posedge Clk) multiplexor (G,E,0,Rst);" or, as is well known to those of ordinary skill in the art, processed further to be "flip_flop(G,E,Clk,Rst);" (a Sequential logic Cell) with "data input" signal E, "data output" signal G, "clock" signal Clk, and "reset" signal Rst. It should be noted that the RTL statement examples set forth above may closely resemble Verilog format, but they can be applicable in other Hardware Description Language formats as well. In accordance with one or more such embodiments, the circuit design is analyzed as above and transformed internally to a cell based representation for the purpose, for example and without limitation, of obtaining a W-neighborhood of cells out of which to select a set of Energy and/or Power Arcs for targeting to generate stimulus segments. That representation can be an approximation depending on how much analysis is done or is possible. For example, always@(posedge Rst or posedge Clk) if (Rst) G=0; else G=E;" can be reasonably represented by flip_flop(G,E,Clk,Rst), or approximated by "always@(posedge Rst or posedge Clk) multiplexor (G,E, 0,Rst); as a Cell based circuit portion. However, the back trace can be performed on the representative cell based design or in the original form (as behavior or RTL description), which is preferred.

The following describes an embodiment of method 2 for dealing with a circuit design at the RTL level where: (a) Cells have not been specified to correspond to logic operations interpreted in the RTL level circuit description; or (b) some portions or an entire circuit description may be Cell based, but some or all the Cells may not have Energy or Power Arcs that can be used for power estimation. In the latter case, this may occur because the Energy and/or Power Arcs are not described in an appropriate format and/or Energy and/or Power Arcs are not externally supplied (for example and without limitation, by a user) for the Cells, or the Cells are not characterized to have such data. In this situation, in accordance with one or more embodiments of the present invention, signal conditions in Energy Arcs may be modeled by taking various value combinations of signals at Cell boundaries. Also Cells may be categorized into, for example and without limitation, Combinational, Sequential, and Complex Cells where: (a) as is well known to those of ordinary skill in the art, Combinational Cells are defined as "and", "or" gates, and so forth; (b) as is well known to those of ordinary skill in the art, Sequential Cells are defined as Flip-Flops, Latches, and so forth; and (c) Complex Cells are defined as Cells that may dissipate a large amount of energy in some of their operations, or large Complex Cells such as RAMs, and so forth. This latter category mostly contains Cells that may require a Macro Activity Model described earlier.

For the Combinational Cell category identified above, Energy Arcs may be approximately modeled and enumerated as follows: for each Cell output signal Y, consider its value to be one of, but not limited to, (E.1) a transition from 0 to 1, and (E.2) a transition from 1 to 0. For each such output Y value, enumerate all possible input signal value combinations that would produce that output Y value transitions (this may require, for example and without limitation, a software module to perform logical analysis on signal behavior within the Cell, or back-tracing limited to the Cell). The resulting enumerated combinations would provide a number of Energy Arc conditions (Event Arcs). For example, for an "and" gate of input signals A and B, (E.1) may yield two Energy Arc signal conditions "01A–>01Y & B" and "01B–>01Y & A".

Additionally, for the Combinational Cell category identified above, Power Arcs may be approximately modeled and enumerated as follows: for each Cell output and input signal Y, consider value of Y to be one of, but not limited to, (P.1) 0, and (P.2) 1. For each such Y value, enumerate all possible input signal value combinations eliminating duplicates. This may require, for example and without limitation, a software module to perform logical analysis on signal behavior within the Cell, or back-tracing limited to the Cell. The resulting enumerated combinations would provide a number of Power Arc conditions (Condition Arcs). For example, for an "and" gate of input signals A, B, and output C, (P.1) may yield, but not limited to, Power Arc signal conditions "!C & !A", "!C & !B", "!A", "!B", "!A&B", "!A&!B", and "A&!B".

For the Sequential Cell category identified above, Energy Arcs may be approximately modeled and enumerated by considering output signals of such Cells as follows: For each Cell output signal Q, consider its value to be one of, but not limited to, (T.1) a transition from 0 to 1, and (T.2) a transition from 1 to 0. For each such Q value, enumerate all possible input and output signal (there may be other output signals in the same Cell) value combinations that would not conflict with that Q value or block the Q value transitions (this may require, for example and without limitation, a software module to perform logical analysis on signal behavior within the Cell, or back-tracing limited to the Cell). The resulting enumerated combinations would provide a number of Energy Arc conditions. For example, for a "flip_flop" of input signals data, D, clock C, and output Q, (T.2) may yield one Energy Arc signal condition "01C–>10Q&!D". In addition, when control signals in a Cell are considered (such control signals can be identified by logical analysis on signal behavior within Cell, or externally identified by the user), for each control signal K (which includes any clock signals), consider its value to be one of, but not limited to, (T.3) a transition from 0 to 1, and (T.4) a transition from 1 to 0. For each such K value, enumerate all other possible input signal value combinations that are possible within the Cell (this may require, for example and without limitation, a software module to perform logical analysis on signal behavior within the Cell, or back-tracing limited to the Cell). The resulting enumerated combinations would provide a number of Energy Arc conditions in addition to what are generated in (T.1) and (T.2). For example, for an "Sflip_flop" of input signals data, D, clock C, set K, and output N, (T.3) may yield several Energy Arc signal conditions "01K–>01N&!C&!D", "01K–>01N&!C&D", "01K–>01N&C&!D", and "01K–>01N&C&D", and so forth.

Additionally, for the Sequential Cell category identified above, Power Arcs may be approximately modeled and enumerated by considering output signals of such Cells as follows: For each Cell output signal Q, consider its value to be one of, but not limited to, (S.1) 0, and (S.2) 1. For each such Q value, enumerate all possible input and output signal value (there may be other output signals in the same Cell) combinations that would not conflict with the selected Q value (this may require, for example and without limitation, a software module to perform logical analysis on signal behavior within the Cell, or back-tracing limited to the Cell). The resulting enumerated combinations would provide a number of Power Arc conditions. For example, for a "flip_flop" of input signals data, D, clock C, and output Q, (S.1) on Q may yield, but not limited to, Power Arc conditions "!Q", "!D&!Q", "D&!Q", "!C &!Q", and "C&!Q". The number of enumerated possibilities can be reduced, if desired, by limiting the combinations to only control and output signals such as C and Q in the above example yielding only "!Q", "!C&!Q", and "C&!Q". In addition, when control signals in a Cell are considered (such control signals can be identified by logical analysis on signal behavior within Cell, or externally identified by the user), for each control signal K (which includes any clock signals), consider its value to be one of, but not limited to, (S.3) 0, and (S.4) 1. For each such K value, enumerate all other possible input signal value combinations that are possible and appropriate for the Cell (this may require, for example and without limitation, a software module to perform logical analysis on signal behavior within the Cell, or back-tracing limited to the Cell). The enumerated combinations would provide a number of Power Arc conditions in addition to what are generated in (S.1) and (S.2). For example, for an "Sflip_flop" of input signals data, D, clock C, set K, and output N, (S.3) on C and K may yield several additional Power Arc signal conditions, but not limited to, "!K", "!C", "!K&C", "K&!C", and so forth.

For the Complex Cell category identified above, a Macro Activity Model is preferred and can be used to generate an Energy Arc and/or a Power Arc using the signal values given in the Macro Activity Model itself. In addition to a Macro Activity Model, or for Cells that do not have a Macro Activity Model, the same treatment as was described above done for Sequential Cells may be utilized to form Energy and Power Arcs. However, it may at times lead to an excessive number of Energy and/or Power Arcs. To reduce the number of such Energy and Power Arcs, a user can externally provide a set of Energy and/or Power Arcs for such Cells. In addition, and in accordance with one or more embodiments of the present invention, the enumerations can be restricted only to a set of, for example and without limitation, user identified control signals in the Cell. For example, a RAM may have CS, WE, and CLK control signals, and 67 non-control (i.e., data) signals. This may produce far fewer Energy and Power Arcs when only three control signals are enumerated as input signals in the method used in the above-described case of Sequential Cells. When bi-directional signals are present on Cells, such signals may be treated to behave as either inputs or outputs depending on value settings on signals controlling such direction. If there is no restriction, they can be taken randomly to be input or output. It is noted that having signal condition expressions even without an associated amount of energy are sufficient for one or more embodiments of the present invention to generate the stimulus segments for subsequent power estimations. Note that if Energy and/or Power Arcs are not present in the Cells nor they are supplied externally to go with the Cells, the final output data file, and Activity Data file may not be useful. But the subsequent steps to determine power estimates may use the stimulus generated. Thus, in accordance with one or more such embodiments, method 2 is utilized to emulate Energy and Power Arcs, which can then be utilized in the manner described above in conjunction with FIG. 1 (i.e. to create W-neighborhood, select Power and/or Energy Arcs, and back-trace to produce stimulus segments). In above described situations where CEValues and EValues are desired, it is possible to consider that all CEValues and EValues are the same, as an approximation. Thus, in accordance with one or more such embodiments, the emulated Energy and/or Power Arcs for the given circuit design reasonably represent the Energy and/or Power Arcs of an equivalent Cell-based circuit design with Cells having Energy and/or Power Arcs to represent the actual technology library cells for the circuit.

The following describes an embodiment of method 3 for dealing for dealing with a circuit design at the RTL level. In accordance with one or more embodiments of the present invention, an RTL description of the circuit can be processed and interpreted as described above to provide a set of logical operations that can be considered to take place inside Combinational Cells, Sequential Cells, and Complex Cells. The following examples illustrate that point further.

EXAMPLE 1

The RTL statement "assign Y=A & B;" is analyzed to be "and_cell (Y,A,B);" The signal behavior inside and_cell is a logic "and" operation. Energy and Power Arcs may be formed for this and_cell using method 2 described above for a Combinatorial Cell.

EXAMPLE 2

The RTL statement block "always@ (A or B or C) if (A) Y=B; else Y=C;" is analyzed to be "always@ (A or B or C) multiplexor_cell (Y, C, B, A);". The signal behavior inside multiplexor_cell is a logical "multiplexing" operation. Energy and Power Arcs may be formed for this Cell using method 2 described above. Back-tracing and signal propagation are done with the statement "always@" which is a well-known Verilog RTL statement. If the original statement were analyzed to be "or_cell(Y,P,Q); and_cell(P,A,B); and_cell(Q,D,C); not_cell(D,A);" as was done in the example set forth in the description of method 1 above, then method 2 described above can be applied for or_cell, and_cell, and not_cell.

EXAMPLE 3

The RTL statement block "always@ (posedge Rst or posedge Clk) if (Rst) G=0; else G=E;" is analyzed to be "always@ (posedge Rst or posedge Clk) multiplexor_cell (G,E,0,Rst);". The signal behavior inside multiplexor_cell is a logical "multiplexing" operation. Energy and Power Arcs are formed for this Cell using method 2 described above. Back-tracing and signal propagation are done with the statement "always@" which is a well-known Verilog RTL statement. Instead, if the original RTL statement were analyzed to be "flip_flop(G,E,Clk,Rst);", the Energy and Power Arcs are formed for this Cell using method 2 described above.

If a Complex or a Macro Cell is used in a circuit described in RTL level, it is most probably contained in a hierarchical design block, and a user of one or more embodiments of the present invention can identify it to provide the Macro Activity Model. Otherwise, since the RTL descriptions of such Complex cells are still done using the same statements and statement blocks which can be analyzed to consist of Combinational and Sequential logic operations (as was described L.2 above), methods 1 and 2 described above can be used to create the Energy and Power Arcs for Complex logic operations. Thus, in accordance with one or more such embodiments, method 3 is utilized in the manner described above in conjunction with FIG. 1. In this case, a software module analyzes the circuit as above and transformed internally to a cell based representation for the purpose, but not limited to, of obtaining a W-neighborhood of cells which approximately represent an equivalent technology Cell based circuit design. These approximated cells are used to emulate Energy and/or Power Arcs, out of which a set of Energy and/or Power Arcs for targeting to generate stimulus segments. In above described situations where CEValues and EValues are desired, it is possible to consider that all CEValues and EValues are the same, as an approximation. However, the back-trace can be performed on the representative cell based design or in the original form (as behavior or RTL description), which is preferred.

Figure 3:
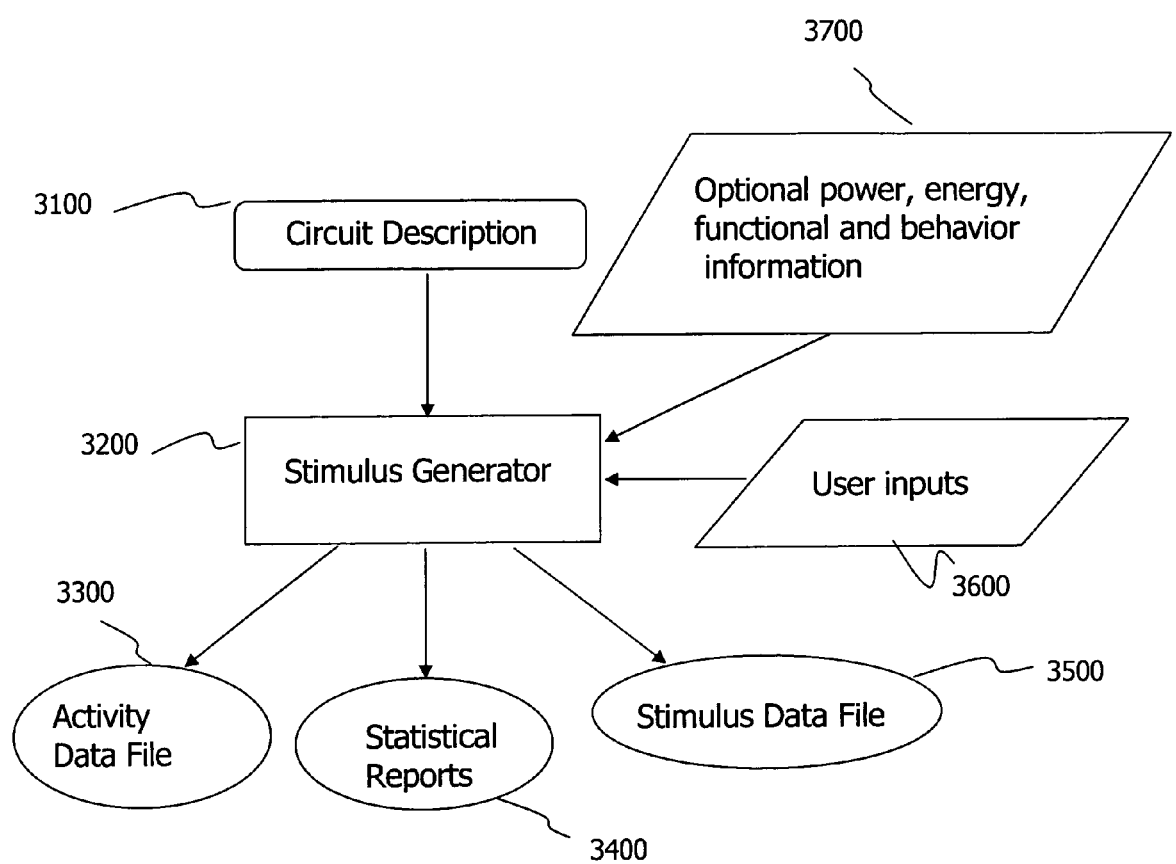
FIG. 3 shows a pictorial representation of inputs to and outputs from a stimulus generator that is fabricated in accordance with one or more embodiments of the present invention.

FIG. 3 shows a pictorial representation of inputs to and outputs from a stimulus generator 3200 that is fabricated in accordance with one or more embodiments of the present invention. It should be understood that the stimulus generator 3200 shown in FIG. 3 may include a computer that runs the software modules described above, it may be a distributed computer system, it may be an Internet implementation on a server, and so forth. As shown in FIG. 3, inputs to the stimulus generator include: (a) a circuit design 3100 that is described using any of the methods described above; (b) optional power and energy information, and functional behavior information 3700; and (c) user inputs 3600 that include any of the inputs described above. As further shown in FIG. 3, outputs from the stimulus generator 3200 include: (a) an Activity Data file 3300; (b) a Stimulus Data file 3600; and (c) reports 3400 about computer resources used and various statistics on stimulus segments such as, without limitation, how many stimulus segments were generated and their lengths.

Although one or more of the above-described embodiments of the present invention can use both Energy Arcs and Power Arcs, it is possible to use only Energy Arcs to obtain power estimation results without considering Power Arcs or vice versa (this choice can be driven, for example and without limitation, by system parameters or by user input). For example and without limitation, in accordance with one or more embodiments of the present invention, Power Arcs are not used to obtain power estimations results: (a) when Power Arcs are not present in Cells and are not supplied by the user; (b) when the Power Arcs do not contribute in any significant way to dynamic power dissipation of the circuit design; (c) when Power Arcs are viewed to be used for static power estimations, and hence are not used for dynamic power calculations; or (d) when the order of magnitude of Power Arcs are much lower than that of Energy Arcs in circuit Cells. For example and without limitation, in accordance with one or more embodiments of the present invention, Energy Arcs are not used to obtain power estimation result: (a) when Energy Arcs are not present in Cells and are not supplied by the user; (b) when the Energy Arcs do not contribute in any significant way to dynamic power dissipation of the circuit design; (c) when Energy Arcs are viewed to be used for Peak power estimations, and hence are not used for dynamic power calculations; or (d) when the order of magnitude of Energy Arcs are much lower than that of Power Arcs in circuit Cells.

Different regions of a circuit may have different supply voltages in certain circuit designs. In such cases: (a) Energy Arcs may contain different Event Arcs and EValues for different supply voltages in the Cells; and (b) Power Arcs may contain different Condition Arcs and PValues for different supply voltages in the Cells. In accordance with one or more embodiments of the present invention, Energy and/or Power Arcs may be selected based on such supply voltages. In accordance with such embodiments, which supply voltage applies to which areas or modules of the circuit design may be provided by user input, or it could be embedded in the circuit description itself, using, for example and without limitation, special statements such as "compiler directives" to be processed and understood by a software module.

Using the described methods in here, it is possible to consider different types of information in Cells for generation of stimulus for circuit analysis under various aspects of a semiconductor circuit design. Any technology information in the cells can be subjected to the treatments described in here, if such information is already described or renders itself to be described in the form of signal Conditions, transitions, and events, which when satisfied lead to a consequential event in a circuit aspect. Some of different categories of circuit features and signal issues are: (a) Electro-migration, (b) Signal Noise Propagation (c) Electrical resistance of signal driver elements (cells), and (d) Voltage Drop analysis. For example, in Voltage Drop analysis the signal events (transitions), when satisfied, would lead to a transient current (analogous to energy released by an Energy Arc) is a prime candidate for the methods described in here. By considering a set of Transient Current Arcs specified in cells and selected by methods described in here, a simulation stimulus set can be generated which would then be simulated and transients currents can be summed up in various circuit segments to obtain the supply voltage drop in the circuit regions considered.

As used herein the terms integrated circuit, IC, chip, device, circuit, semiconductor circuit, semiconductor chip, semiconductor device, semiconductor integrated circuit all relate to circuits to which one or more embodiments of the present invention may be applied. In addition, the term W-neighborhood includes embodiments wherein such W-neighborhood is formed using different W values in different areas of the circuit, such as, but not limited to, by taking a random value for W between one and the total number of cells in the circuit for every new addition in to the W-neighborhood. Such randomly selected W-neighborhoods may be useful as well.

As used herein the terms integrated circuit, IC, chip, device, circuit, semiconductor circuit, semiconductor chip, semiconductor device, semiconductor integrated circuit all relate to circuits to which one or more embodiments of the present invention may be applied. In addition, the term user input includes embodiments wherein such user input is supplied using a user interface terminal with a GUI interface as well as user input supplied by machine loaded files or data. Such machine loaded files or data may be supplied by any device known such as, without limitation, modem, cable, wireless, computer-to-computer, over the Internet, and so forth.

Although various embodiments that incorporate the teachings of the present n have been shown and described in detail herein, those skilled in the art can devise many other varied embodiments that still incorporate these teachings.

What is claimed is:

1. A method for estimating a power requirement of a circuit design that comprises steps of:

selecting a set of targeted Energy Arcs and/or Power Arcs;

creating one or more circuit states using the set of targeted Energy and/or Power Arcs;

back-tracing the one or more circuit states over one or more simulation clock cycles to form a start circuit state and a stimulus segment;

simulating the stimulus segment in forward time progression and determining which Event Arcs in Energy Arcs and/or which Condition Arcs in Power Arcs are satisfied at each stimulus clock cycle; and recording data at each stimulus clock cycle that is utilized to estimate the power requirement.

2. The method of claim 1 wherein the one or more simulation clock cycles is less than or equal to a maximum number.

3. The method of claim 2 wherein the maximum number is chosen so that the estimate of the power requirement becomes insensitive to increases in the maximum number wherein the maximum number is three.

4. The method of claim 1 wherein the set of targeted Energy Arcs and/or Power Arcs are chosen from a group of Cells used in specifying the circuit design.

5. The method of claim 1 wherein the set of target Energy Arcs and/or Power Arcs are chosen from a group of Cells that is logically equivalent or approximately logically equivalent to the circuit design.

6. The method of claim 4 wherein the step of selecting comprises creating a W-neighborhood of Cells and wherein the group is the W-neighborhood of Cells.

7. The method of claim 6 wherein the step of selecting includes utilizing a Macro Activity Model for Macro Cells.

8. The method of claim 7 wherein the steps of creating and back-tracing include utilizing the Macro Activity Model.

9. The method of claim 1 wherein the data is analyzed for a predetermined number of simulation clock cycles to determine an estimate of Peak Power.

10. The method of claim 6 wherein the step of creating a W-neighborhood of Cells comprises selecting a seed Cell.

\* \* \* \* \*